(12) United States Patent
Rosenberg et al.

(10) Patent No.: US 6,309,595 B1
(45) Date of Patent: Oct. 30, 2001

(54) TITANIUM CRYSTAL AND TITANIUM

(75) Inventors: Harry Rosenberg, Pittsburgh, PA (US); Nigel Winters, Sandy, UT (US); Yun Xu, Pittsburgh, PA (US)

(73) Assignee: The AltalGroup, Inc, Fombell, PA (US)

( * ) Notice: Subject to any disclaimer, the term of this patent is extended or adjusted under 35 U.S.C. 154(b) by 0 days.

(21) Appl. No.: 08/994,733

(22) Filed: Dec. 19, 1997

Related U.S. Application Data

(63) Continuation-in-part of application No. 08/846,289, filed on Apr. 30, 1997, now abandoned.

(51) Int. Cl.$^7$ .................................................. C22C 14/00
(52) U.S. Cl. ........................................... 420/417; 148/421
(58) Field of Search ......................... 420/417; 148/421; 75/10.25, 10.26, 10.28, 615, 616, 617

(56) References Cited

U.S. PATENT DOCUMENTS

| | | | |
|---|---|---|---|
| Re. 34,598 | 5/1994 | Shimotori et al. | 257/770 |
| 2,943,032 | 6/1960 | Benner | 204/64 |
| 3,087,873 | 4/1963 | Slatin | 204/71 |
| 3,114,685 | 12/1963 | Alpert | 204/64 |
| 4,381,976 | 5/1983 | Armand | 204/64 |
| 4,670,121 | 6/1987 | Ginatta et al. | 204/225 |
| 4,793,854 | 12/1988 | Shimotori et al. | 75/10.1 |
| 4,891,066 | 2/1990 | Shimotori et al. | 75/84 |
| 5,196,916 | 3/1993 | Ishigami et al. | 257/769 |
| 5,336,378 | 8/1994 | Nishimura et al. . | |

FOREIGN PATENT DOCUMENTS

| | | |
|---|---|---|
| 0408383 | 1/1991 | (EP) . |
| 0442752 | 8/1991 | (EP) . |
| 0653498 | 5/1995 | (EP) . |
| 6261705 | 10/1987 | (JP) . |
| H2213490 | 8/1990 | (JP) . |
| 3130339 | 6/1991 | (JP) . |
| 61123463 | 11/1992 | (JP) . |
| 5214521 | 8/1993 | (JP) . |
| 8165566 | 6/1996 | (JP) . |
| 8232061 | 9/1996 | (JP) . |
| 8269698 | 10/1996 | (JP) . |
| 2185734 | 12/1996 | (JP) . |
| 9-49074 | 2/1997 | (JP) . |
| WO9620892 | 7/1996 | (WO) . |
| WO9628583 | 9/1996 | (WO) . |

OTHER PUBLICATIONS

M–A Nicolet et al., "Diffusion Barriers in Layered Contact Structures", J. Vac. Sci. Technol 19 (3), Sep./Oct. 1981, pp. 786–793.

H. Smith et al., "Electron–Bombardment Melting", Journal of Metals, Feb. 1959, pp 112–117.

S.C. Liang, Impurities in Refractory Metals/Silicides, J. Vac Sci. Technol B2(4), Oct.–Dec. 1984, pp 714–717.

D.H. Baker, Jr. et al., "Titanium Electrorefining Cathode Studies and Deep Bath Deposition", Bureau of Mines Report of Investigation 5481, 1958, pp 1–11.

G.T. Murray, "Preparation and Characterization of Pure Matels", Metals Handbook, Ninth Edition, vol.2, Properties and Selection: Nonferrous Alloys and Pure Metals, ASM, 1979, pp 709–712.

M. Nardin et al., "Continuous Production of Titanium from Ticl$_4$ in Molten Salts", The Institute of Mining and Metallurgy, Proceedings of a symposium held in Grenoble, France, Sep. 1977, pp 38–41.

(List continued on next page.)

*Primary Examiner*—John Sheehan
(74) *Attorney, Agent, or Firm*—Wells, St. John, Roberts, Gregory, & Matkin, P.S.

(57) ABSTRACT

This invention includes a method and an apparatus for producing high purity titanium and high purity titanium so produced. The high purity titanium comprises titanium and less than 0.1 ppm, by weight, total of sodium, potassium, aluminum, iron, chromium, zirconium, vanadium and nickel.

36 Claims, 8 Drawing Sheets

OTHER PUBLICATIONS

R. Bunshah et al., Deposition Technologies for Film and Coatings, "Developments and Applications", 1982, pp178–179.

R. Bunshah et al., Deposition Technologies for Films and Coatings, "Developments and Applications", 1982, pp 232–233.

Y. Yoshimura et al., "Production of High Purity Titanium by the Iodide Process", Materia Japan, vol. 33, No. 1, 1994, pp 48–50 (with English translation).

R. Rolsten, "Periodic System, Fourth Subgroup: Titanium, Zirconium, Hafniu, Thorium", Iodide Metals and Metal Iodides, Chapter 4, 1961, pp 18–41.

Ghate, "Deposition Technologies for Thin films and Coatings", 1982 p 518.

G. Dieter, Jr., "Deformation by Slip", Mechanical Metallurgy, Chapter 4 Section 4.9), 1961, pp 90–93.

Dieter, Jr., "Mechanical Metallurgy", *Metallurgy and Metallurgical Engineering Series*, 1961, pp. 104–105 and 90–93.

M. Nardin et al., "Electrochemical Reduction of $TiCl_4$ in Baths of Low–melting–point Chlorides", The Institute of Mining and Metallurgy, Proceedings of a symposium held in Grenoble, France, Sep. 1977, pp 35–37.

J. Bigot, "Preparation du Titane De Haute Purete Par Le Procede Van Arkel", Centre d'Etudes de Chimie Metallurgique, C.N.R.S., Vitry/Seime (France) Oct. 1975, pp 151–155 (no translation).

*Concise Science Dictionary*, pp 663 and 659–660, 1984.

*Harada, Sodium–Reduced Titanium Sponge, Chitaniumu Jirukoniumu, vol. 30, No. 2, pp 83–89, 1982 (abstract only).

"High Purity Ti Sputter Target for VLSTs"; Toshiba Review No. 161, Autumn, 1987; Authors: Takashi Ishigami, Hideo Ishihara and Kazumi Shimotori.

"Titanium Sponge Production Technology"; Titanium '95: Science and Technology; Author: Yukio Okura; pp 1427–1437, 1995.

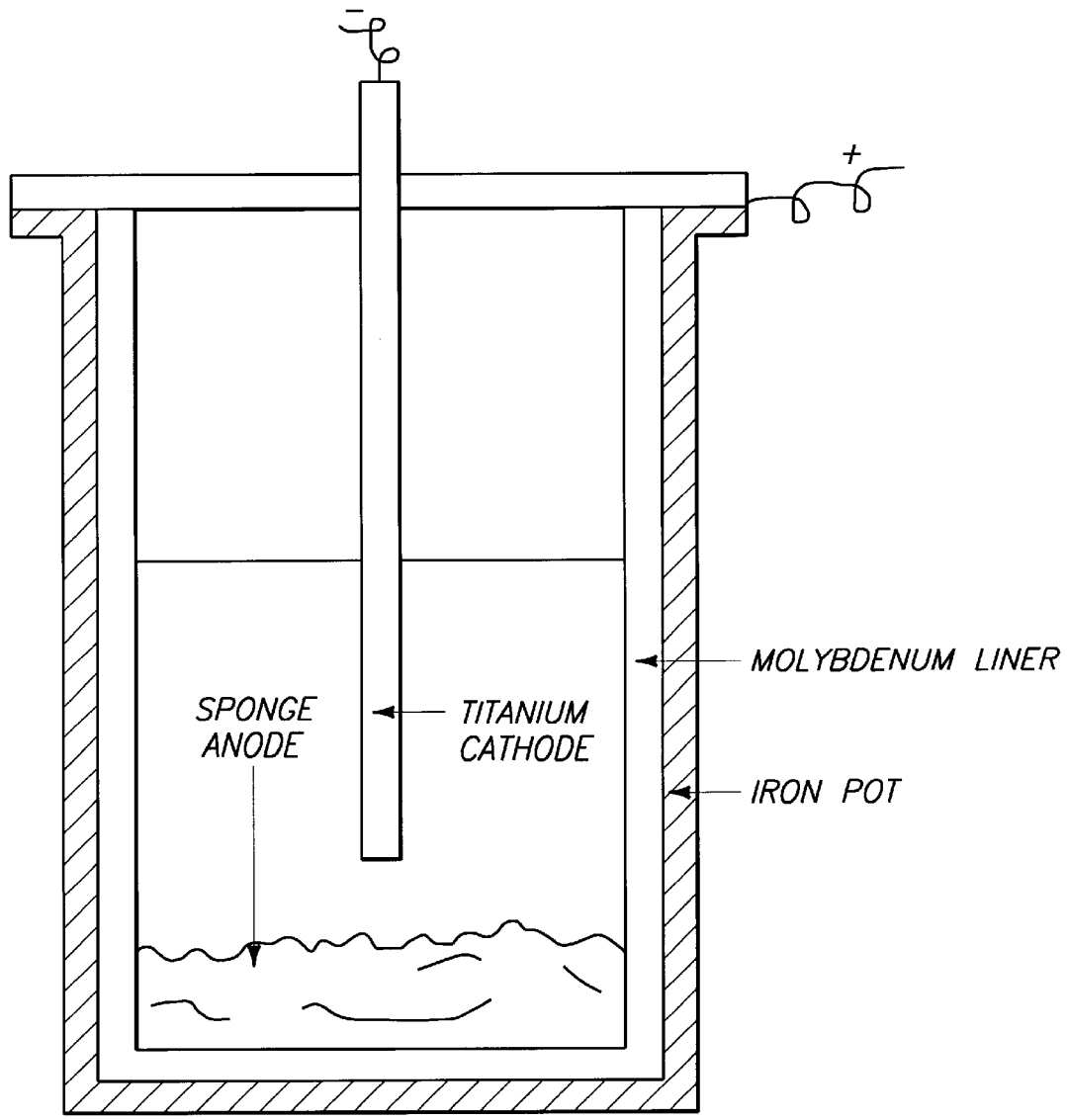

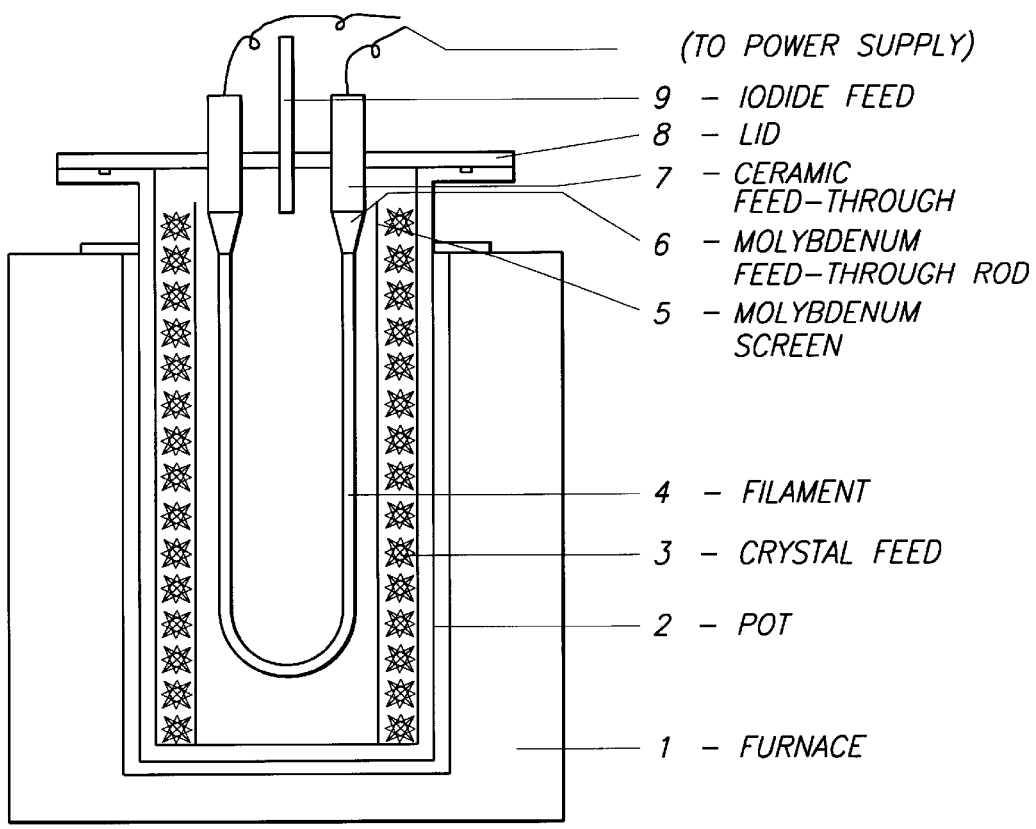

TITANIUM CRYSTAL AND TITANIUM

CROSS REFERENCE TO RELATED APPLICATION

This application is a continuation-in-part of application Ser. No. 08/846,289, filed Apr. 30, 1997, abandoned.

FIELD OF THE INVENTION

This invention relates to a method and apparatus for producing high purity titanium crystal and titanium and high purity titanium crystal and titanium so produced. The invention involves producing titanium sponge and performing titanium fused salt electrolysis in situ in the same container in which titanium sponge is produced to produce high purity titanium crystals and, where especially low oxygen content is desired, to treat the high purity titanium crystal as produced with iodine described herein.

BACKGROUND OF THE INVENTION

Currently, high purity Ti is used extensively in the fabrication of microprocessors and similar components for the microelectronics industry. Constantly evolving microprocessor capabilities (increasing integration, decreasing circuit element dimensions) have driven producers to meet the demands of chip manufacturers for increasingly pure titanium.

High purity Ti targets are used in sputtering applications to produce thin films on microprocessors, integrated circuits, DRAMs, flat panel displays, etc. Purity requirements range from 99.99% (4N) to 99.99999% (7N), depending on the application. For improved end usage properties, it is of interest to decrease impurity elements including, but not limited to, alkali metals such as Na and K, heavy metals such as Fe, Ni and Cr, radio active elements such as U and Th and gases, especially oxygen. These elements have undesirable affects on properties; for example, Fe contamination degrades film patterning and circuit element registry, oxygen affects the resistivity of the deposited film; Na and K migrate from deposited films into active transistor elements thus degrading performance, and U and Th are both alpha-emitters which can cause adjacent solid state switches to change state. So called "6N" purity Ti, where total impurities (excluding gases) are less than 1 ppm, and with low oxygen, ea. <100 ppm, is presently desired in the industry for many of the above applications. Lowering the amounts of impurity elements can improve the performance of the sputtering process and increase the reliability and speed of the microprocessor or memory device in which the high purity titanium is used.

Common processes for producing high purity titanium include: (1) producing Ti sponge by reacting $TiCl_4$ with a reducing agent such as Mg or Na in a vessel designed for this purpose, (2) vacuum distilling Ti sponge in a vacuum distilling apparatus to remove residual salt or otherwise treat sponge to remove residual salt, (3) electrolyze Ti sponge in an electrolytic cell by fused salt electrolysis, and (4) melting Ti using an electron-beam furnace or similar high-vacuum melting process. Titanium sputtering targets may be produced from ingot produced by a combination of these processes.

SUMMARY OF THE INVENTION

In accordance with the invention there is provided a method and apparatus for producing high purity titanium and high purity titanium so produced.

The method comprises reacting titanium tetrachloride with a reducing agent comprising an alkali and/or alkaline earth metal in a container to produce titanium sponge and molten salt, chlorinating the salt in the same container (see equations (2) and (3)), electrolyzing the titanium sponge in situ in the same container to produce titanium crystal, recovering titanium crystal from the container and removing salt from the titanium crystal. Advantageously, the container is provided with a reactant-contacting surface comprising a metal electrochemically more noble than titanium according the chloride electromotive series. Preferably, the reducing agent comprises sodium magnesium, potassium, calcium and/or lithium or alloys of each together, and the reactant-contacting surface preferably comprises molybdenum, nickel or molybdenum/nickel alloy.

A suitable apparatus in accordance with the invention comprises a container capable of being maintained "air tight" provided with means for feeding raw material, a cathode and an anode and a reactant-contacting surface comprising a metal more electrochemically noble than titanium according to the chloride electromotive series. The apparatus is capable of accommodating both titanium sponge production and fused salt electrolysis and thus is capable of facilitatinl, both reduction and electrolysis without removal of the reduction reaction products from the container prior to electrolysis. Salt produced during the reduction of titanium tetrachloride is capable of serving as the salt bath for the electrolysis process.

In another embodiment the high purity titanium crystal produced as described above is further reacted with iodine to produce $TiI_2$ and $TiI_4$ and thermally decomposed in a container at elevated temperature under vacuum to result in high purity titanium with an oxygen content less than about 50 ppm, and even less than about 30 ppm. Advantageously, the reaction temperature used is in the range of about 500° C. to 800° C., preferably about 750° C. to 775° C., the decomposition temperature is about 1150° C. to 1450° C., preferably about 1300° C. to 1400° C., and the pressure up to about 1000 microns, preferably about 100 to 500 microns.

This method comprises producing high purity titanium crystal as described, treating the titanium crystal with iodine to form titanium iodide and decomposing the iodide at elevated temperature and under reduced pressure to produce titanium crystal bar containing less than about 50 ppm oxygen.

The process of the invention is capable of producing high purity titanium sponge containing less than 1 ppm, by weight, total of Be, Mn, Zr, Al, and V and less than 1 ppm, by weight, total of Yb, Zn, Cr, Cd, B, and Sn. It is also possible to produce titanium sponge having less than 1 ppm. by weight, total of all the foregoing, that is, Be, Mn, V, Zn, Cr., Al, Yb, Cd, Zr, B and Sn.

High purity titanium crystal in accordance with the invention comprises titanium with less than 1 ppm, by weight, total of sodium, potassium, aluminum, iron, chromium and nickel, less than 1 ppb. by weight, total of uranium and thorium, and less than 10 ppb, by weight, total of sodium and potassium, excluding gases and mechanically entrapped salt.

It should be noted that the descriptions of titanium compositions herein expressly excludes mechanically entrapped salt, whether so stated or not. Thus, for example, expressions of titaidum purity and references to amounts of impurities exclude any consideration of amount of salt that may be mechanically entrapped within the titanium. The term "mechanically entrapped salt" refers to, without limitation, salt, e.g. NaCl, which may be physically trapped in voids, cavities, crevices and/or pockets in titanium as crystal intergrowth occurs and is neither dissolved in or alloyed with the metal to any significant extent.

The method(s) of chemical analysis used to derive the chemical descriptions set forth herein are the methods known as glow discharge mass spectroscopy (GDMS) and furnace atomic absorption (FAA) for metallic elements and LECO gas analyzers for gas anaivsis, using calibration samples traceable to National Institute of Standards and Technology (NIST).

BRIEF DESCRIPTION OF THE DRAWINGS

FIG. 7 is a schematic of an illustrative container with a Mo-liner; and

FIG. 8 is a diagram of an iodide cell useful to treat high purity titanium crystal to reduce the oxygen content.

DETAILED DESCRIPTION OF THE INVENTION

Figure 1:
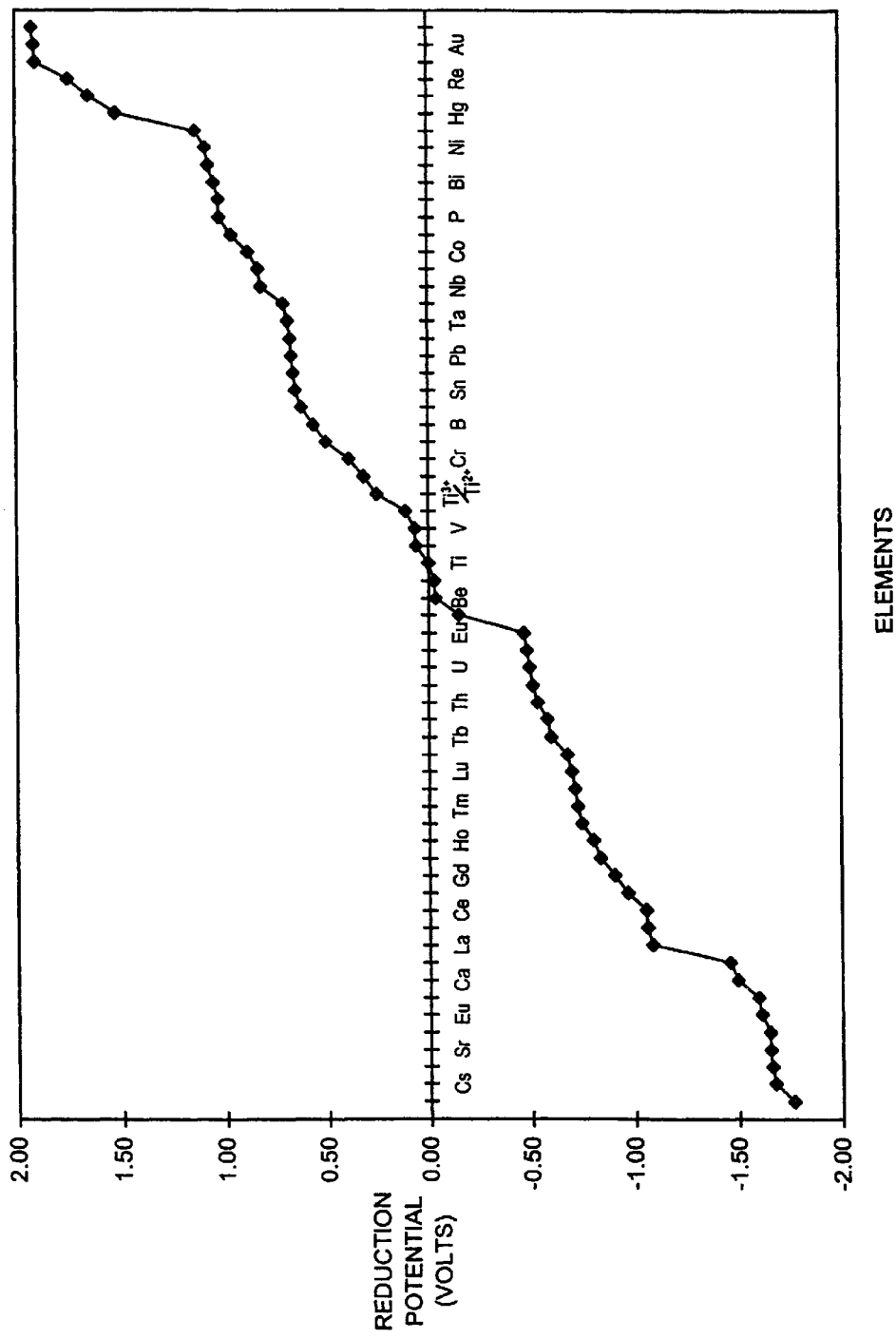
FIG. 1 is a graphical rendition of fused salt electromotive series.

In the titanium sponge production process, $TiCl_4$ is reacted with molten Na (or Mg) to produce Ti sponge, with NaCl (or $MgCl_2$) as a byproduct, reaction (1) below. $TiCl_2$ is used as a carrier salt during electrolysis and is produced by the reaction of Ti sponge with $TiCl_4$ according to reaction (2) below. $TiCl_2$ may be reacted with excess TiCl, reaction (3) below to produce $TiCl_3$.

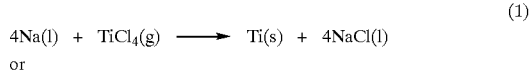
(1)

(2)

(3)

The above reactions (2) and (3) chlorinate the salt bath for electrolysis. Reaction (2) is favored about 4:1 over reaction (3) resulting in an average atomic valence state of Ti of about 2.2 in the presence or excess sponge. Other means of chlorinating, the salt bath may be used to provide necessary electrolysis conditions. For example, $TiCl_2$ salt may be added directly to the electrolyte bath.

Reducing agents useful to produce sponge via reduction of $TiCl_4$ include in addition to Na, Mg, Ca, K and Li, which propagate reactions similar to those described above. The most common sponge producing reactions are the Hunter process using Na and the Kroll process using Mg.

By electrolyzing sponge directly in situ after it is produced in the reduction container, all post-reduction process-ing steps and the related contamination sources and processing costs are eliminated. The salt coproduct of the reduction reaction comprises the electrolyte and contains a negligible moisture content which can act as an oxygen source. This is achieved by incorporating sponge production and fused salt electrolysis into a single unit operation.

A number of potential sources of contamination in conventional processes have been identified. For example, mild steel components even though not in direct contact with the salt bath can indirectly contaminate the salt bath and Ti crystal. Mild steel oxidizes readily in the presence of moist air, salt and heat such that iron oxides form and tlake off of the parent material. Titanium crystal processing can also introduce impurities if care is not taken to ensure the crystal doesn't contact any material other than Ti or Ti alloys or material more electrochemically noble than titanium on the chloride electromotive series. Even ambient contaminants can adversely affect crystal quality. "Ambient contamination" includes external impurities that may be present in the atmosphere or environment or equipment involved.

For electrolytic Ti refining processes in which salt is obtained from commercial suppliers, moisture content of the salt can be a source of oxygen contamination. Pretreating, or drying, the salt bath is necessary to remove the moisture. Generally, melting the salt vaporizes much of the water and can be removed from the cell by vacuum pumps. An ideal Ti refining process would ensure that no moisture enters the cell via raw materials or other means.

The process described herein produces high-purity titanium crystal by fused salt electrolysis of sponge which is produced via reduction of $TiCl_4$ in a mainer such that the Ti sponge need not be processed prior to electrolysis and the resulting Ti is of very high purity. In this process Ti is produced by fused salt electrolysis of sponge in situ such that the sponge is not processed or removed from the reduction vessel prior to electrolysis and the salt coproduct of the sponge producing reduction reaction comprises the electrolyte and the electrolysis is performed in situ in the same vessel. The reducing agent, e.g. Na, and $TiCl_4$ are reacted to form Ti sponge and NaCl. The salt is then chlorinated and is subsequently electrolyted. Ti crystal produced is acid leached and rinsed to remove residual salts and vacuum-dried or dried using a heated argon sweep. Other drying methods such as freeze drying may be also used.

In lieu of single element reducing agents, such as pure Na, combinations of reducing agents can also be used in a single reaction producing titanium sponge and a mixture of salts. The benefit of using a combination of reactants is that the resulting salt bath will melt at a lower temperature. For example, using NaK and Na to react with $TiCl_4$ the salt bath mixture melts at around 660° C. as opposed to over 800° C. for pure NaCl. Controlling the composition of the salt mixture lowers subsequent electrolysis operating costs and permits a wider operating temperature range for electrolysis.

Sodium is the preferred reducing agent in accordance with the invention because it is easier to purify than magnesium. Furthermore, NaCl is much less hygroscopic than is $MgCl_2$. Purification of $TiCl_4$ and the reducing agent, e.g. sodium and $TiCl_4$ is referred to as "precursor" purification and is but one factor affecting purity of resulting titanium sponge. Pretreating $TiCl_4$ and Na to reduce metallic impurities to less than 1 ppm in each of $TiCl_4$ and Na, and preferably to less than 0.1 ppm in each of $TiCl_4$ and Na, also enable production of high purity titanium sponge as described herein.

A second factor is the procedure used. The reaction between $TiCl_4$ and Na is highly exothermic; that is large amounts of heat are generated. For example, feeding precursors at a too-high rate can actually melt the container. The preferred practice for the invention is to feed at a rate slow enough that reactions among container, reactants and products are minimized; at the same time, it is preferred to cool the container exterior to prevent overheating. Wall design is another consideration to maximize thermal conductivity. For example, a container may well have two or even three layers such as, for example, an outer shell of stainless steel, a main wall of mild steel and an inner wall of a material more electrochemically noble than titanium on the chloride electromotive series. A useful material as discussed further below is molybdenum. The physical contact between layers is another factor because the more intimate that contact, the better the thermal conductivity.

A third factor that contributes to production of high purity titanium is the reactant-contacting surface of the container. Not all materials are suitable for containing the reaction. Container materials must not melt at too low a temperature nor react with any precursor of product. The container material must not alloy readily with titanium during the process and the reactant-contacting surface must be significantly more noble than titanium on the chloride electromotive series, as will be hereinafter discussed.

Table 1 and FIG. 1 illustrate the chloride electromotive series (emf series) and how it can be used in accordance with the invention in connection with the apparatus and electrolysis process. The electrorefining capability is controlled by a selective oxidation process occurring at the anode and a selective reduction process occurring at the cathode. These processes, in turn, are controlled by two major mechanisms—one is based on the electrolysis reaction that occurs according to the sequence of the electro-potential (emf series) derived from the Nernst equation and the other is based on the suppression reaction of $MCl_n + nTiCl_2 \rightleftharpoons nTiCl_3 + M(s)$, where M denotes an impurity element and n denotes its valence state when it forms a chloride salt. As a practical matter, an overvoltage of 0.5 volts was selected for the electrolysis reaction and an overvoltage of 0.3 volts was selected for the suppression reaction. By combining these two mechanisms with the two processes at the anode and the cathode, and by taking into consideration kinetic overvoltage, the electrorefining titanium "window elements" can be defined. These window elements are so sensitive to overvoltage that they cannot be effectively electrolyzed out in industrial practice. Electrolysis is therefore not effective against impurities such as Mn and V and only slightly useful against Cr under commercial conditions. Also, under conditions of high overvoltage on the electrodes, electrolysis is less effective against those metals lying close to the window boundaries. Control of overvoltage is effective in controlling iron. Other methods must be used to eliminate Al, Mn, Zr, Be and V.

Electrolysis in situ works for Ti by taking the chloride electromotive series into consideration since alkali, alkaline earth and rare earth metals remain in the molten salt bath.

In a molten salt containing $Ti^{2+}$, the suppression reaction is spontaneous and in the case of Fe there is enough energy to spare so that Fe does not effectively electrolyze (oxidize off the anode) even if the anode is pure Fe.

Electrolysis can also produce titanium crystal with very low oxygen content. However, because of poor shelf life, unless packed in vacuum or under argon cover, ingot melted from such crystal may not be as pure as the crystal. However, it has been found that if the iodide process is applied to titanium crystal produced by the above-described in situ process, as starting material, oxygen may be reduced to 30 ppm or less and iodide crystal bar has excellent shelf life.

Figure 2:
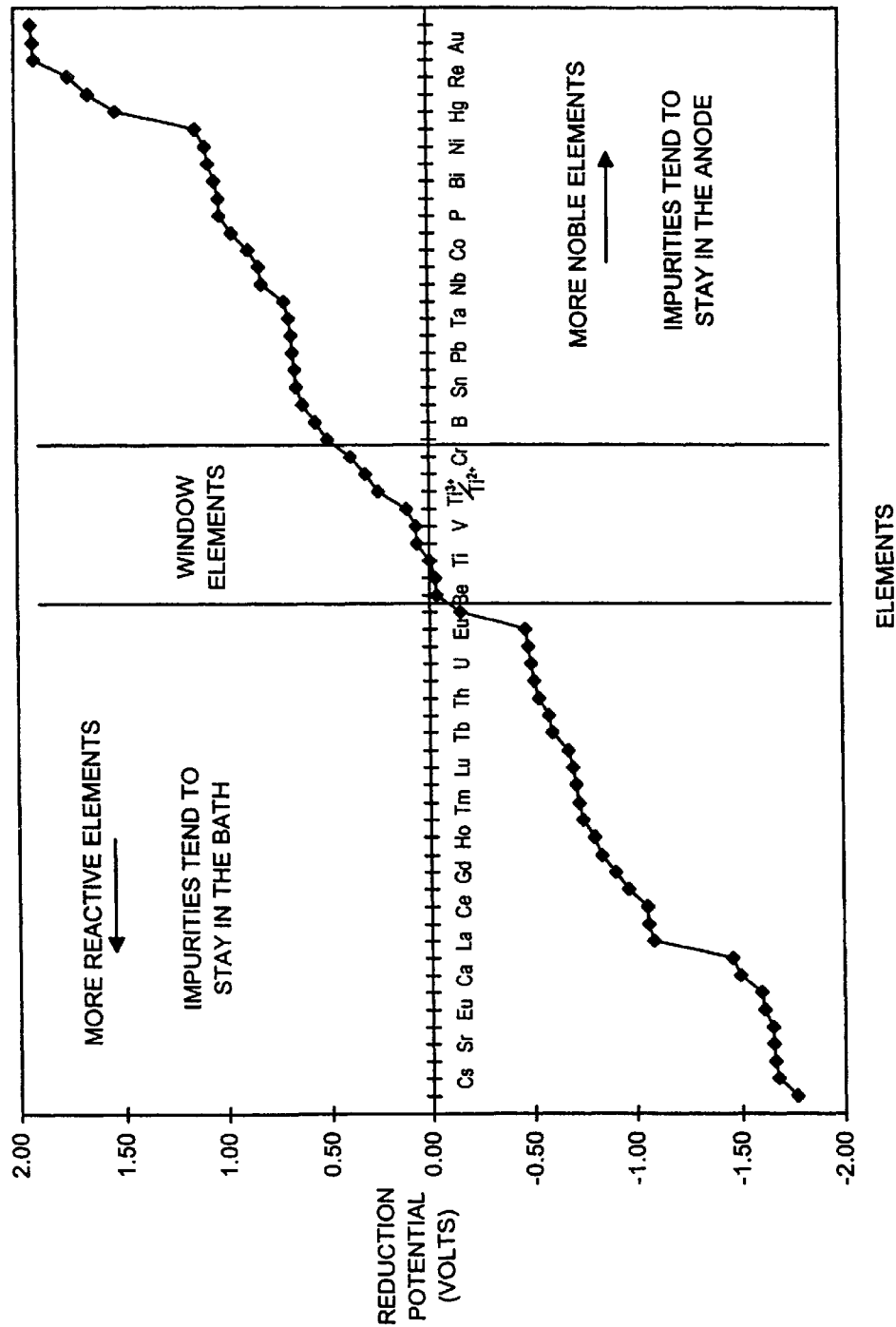
FIG. 2 is a graph similar to FIG. 1 but indicating the "window elements" and the elements that tend to stay in the bath or anode during electrolysis.

FIG. 2 illustrates the refining features of electrolysis indicating the impurities that tend to stay in the bath or anode. The window elements must be precluded or removed in other ways. Removing these elements from the precursors and then keeping them out afterwards contributes to production of high purity titanium.

The fused salt electromotive series at operating temperature is critical to understanding and controlling the electrolysis process. The electromotive series, for example, may be calculated from the JANAF Thlermochemical Tables, 3rd Ed., and older sources such as Bulletin 605 by the US Bureau of Mines. FIG. 1 illustrates the series. For these calculations, a few salts vaporized below, or are solid at, the melting point of NaCl. In these cases, the electrolysis potentials were estimated by linear extrapolations to 1100 K of the free energies of formation. In each case the potential was calculated using the Nernst equation assuming unit activity and equilibrium. Neither condition holds for actual electro-refining because impurities are not at unit activity nor does equilibrium prevail-the over potential is a measure of the polarization present as an electrolysis cell departs from equilibrium during operation. The electromotive series is therefore the limiting condition from which everything departs. In operation, the concentration of the various impurities must be taken into account and, of course, the applied voltage is adjustable to compensate for feedstock purity and operating temperature.

TABLE 1

| Data Source | Reaction | Reference | | | |
|---|---|---|---|---|---|
| | | $Cl^{1-}/Cl$ | $Ag^{1+}/Ag$ | $Ti^{2+}/Ti$ | $Ti^{3+}/Ti^{2+}$ |
| $J_1$ | $Ba^{2+}/Ba$ | -3.53 | -2.73 | -1.76 | -2.02 |
| $J_1$ | $Cs^{1+}/Cs$ | -3.44 | -2.64 | -1.67 | -1.93 |
| BM | $Sm^{2+}/Sm$ | -3.42 | -2.62 | -1.66 | -1.91 |
| $J_1$ | $Sr^{2+}/Sr$ | -3.41 | -2.61 | -1.65 | -1.91 |
| $J_1$ | $K^{1+}/K$ | -3.41 | -2.61 | -1.65 | -1.90 |
| BM | $Eu^{2+}/Eu$ | -3.37 | -2.57 | -1.61 | -1.86 |
| $J_1$ | $Li^{1+}/Li$ | -3.36 | -2.56 | -1.60 | -1.85 |
| $J_1$ | $Ca^{2+}/Ca$ | -3.26 | -2.46 | -1.49 | -1.75 |
| $J_1$ | $Na^{1+}/Na$ | -3.22 | -2.42 | -1.46 | -1.71 |
| BM | $La^{3+}/La$ | -2.85 | -2.04 | -1.08 | -1.34 |
| BM | $Pr^{3+}/Pr$ | -2.82 | -2.02 | -1.06 | -1.31 |
| BM | $Ce^{3+}/Ce$ | -2.82 | -2.02 | -1.05 | -1.31 |
| BM | $Nd^{3+}/Nd$ | -2.73 | -1.93 | -0.97 | -1.22 |
| BM | $Gd^{3+}/Gd$ | -2.67 | -1.86 | -0.90 | -1.16 |
| BM | $Y^{3+}/Y$ | -2.60 | -1.80 | -0.83 | -1.09 |
| BM | $Ho^{3+}/Ho$ | -2.58 | -1.76 | -0.80 | -1.05 |
| BM | $Er^{3+}/Er$ | -2.51 | -1.71 | -0.74 | -1.00 |
| BM | $Tm^{3+}/Tm$ | -2.49 | -1.69 | -0.73 | -0.98 |
| BM | $Pm^{2+}/Pm$ | -2.48 | -1.67 | -0.71 | -0.97 |
| BM | $Lu^{2+}/Lu$ | -2.46 | -1.66 | -0.70 | -0.95 |
| $J_1$ | $Mg^{2+}/Mg$ | -2.44 | -1.64 | -0.68 | -0.93 |

TABLE 1-continued

| | | | | | |
|---|---|---|---|---|---|
| BM | $Tb^{3+}/Tb$ | -2.36 | -1.56 | -0.60 | -0.85 |
| BM | $Sc^{3+}/Sc$ | -2.34 | -1.54 | -0.58 | -0.83 |
| BM | $Th^{3+}/Th$ | -2.30 | -1.49 | -0.53 | -0.79 |
| BM | $Dy^{3+}/Dy$ | -2.27 | -1.47 | -0.51 | -0.76 |
| BM | $U^{3+}/U$ | -2.26 | -1.46 | -0.49 | -0.75 |
| BM | $Hf^{4+}/Hf$ | -2.24 | -1.44 | -0.48 | -0.74 |
| BM | $Eu^{3+}/Eu$ | -2.23 | -1.43 | -0.47 | -0.72 |
| BM | $Yb^{3+}/Yb$ | -1.91 | -1.11 | -0.15 | -0.40 |
| $J_l$ | $Be^{2+}/Be$ | -1.80 | -1.00 | -0.03 | -0.29 |
| BM | $Mn^{2+}/Mn$ | -1.79 | -0.99 | -0.03 | -0.28 |
| $J_s$ | $Ti^{2+}/Ti$ | -1.76 | -0.96 | 0.00 | -0.25 |
| $J_l$ | $Al^{3+}/Al$ | -1.70 | -0.90 | 0.06 | -0.19 |
| BM | $V^{3+}/V$ | -1.70 | -0.89 | 0.07 | -0.19 |
| $J_s$ | $Ti^{3+}/Ti$ | -1.68 | -0.88 | 0.08 | -0.17 |
| $J_s$ | $Zr^{3+}/Zr$ | -1.65 | -0.85 | 0.11 | -0.14 |
| | $Ti^{3+}/Ti$ | -1.51 | -0.71 | 0.25 | 0.00 |
| BM | $Zn^{2+}/Zn$ | -1.45 | -0.65 | 0.32 | 0.06 |
| BM | $Cr^{2+}/Cr$ | -1.37 | -0.57 | 0.39 | 0.13 |
| BM | $Cd^{2+}/Cd$ | -1.26 | -0.46 | 0.50 | 0.25 |
| $J_g$ | $B^{3+}/B$ | -1.20 | -0.40 | 0.56 | 0.31 |
| BM | *$Cb^{5+}/Cb$* | *-1.14* | *-0.34* | *0.62* | *0.37* |
| BM | *$Sn^{2+}/Sn$* | *-1.11* | *-0.31* | *0.65* | *0.40* |
| $J_l$ | $Fe^{2+}/Fe$ | -1.10 | -0.30 | 0.66 | 0.41 |
| $J_l$ | $Pb^{2+}/Pb$ | -1.09 | -0.29 | 0.67 | 0.42 |
| $J_g$ | $Si^{2+}/Si$ | -1.09 | -0.28 | 0.68 | 0.42 |
| $J_l$ | *$Ta^{2+}/Ta$* | *-1.07* | *-0.27* | *0.69* | *0.43* |
| $J_g$ | $H_2^{1+}/H$ | -1.05 | -0.25 | 0.71 | 0.46 |
| $J_l$ | *$Nb^{5+}/Nb$* | *-0.94* | *-0.14* | *0.82* | *0.56* |
| $J_l$ | $Cu^{1+}/Cu$ | -0.93 | -0.13 | 0.83 | 0.58 |
| $J_l$ | $Co^{2+}/Co$ | -0.88 | -0.08 | 0.88 | 0.63 |
| BM | $Ag^{1+}/Ag$ | -0.80 | 0.00 | 0.96 | 0.71 |
| $J_g$ | $P^{3+}/P$ | -0.74 | 0.06 | 1.02 | 0.77 |
| BM | *$Sb^{3+}/Sb$* | *-0.74* | *0.06* | *1.02* | *0.77* |
| BM | $Bi^{3+}/Bi$ | -0.72 | 0.08 | 1.05 | 0.79 |
| $J_s$ | $W^{2+}/W$ | -0.69 | 0.11 | 1.07 | 0.82 |
| $J_l$ | $Ni^{2+}/Ni$ | -0.67 | 0.13 | 1.09 | 0.83 |
| $J_l$ | $Mo^{4+}/Mo$ | -0.63 | 0.17 | 1.14 | 0.88 |
| $J_l$ | $Hg^{2+}/Hg$ | -0.24 | 0.56 | 1.52 | 1.27 |
| $J_g$ | $S^{2+}/S$ | -0.11 | 0.69 | 1.65 | 1.40 |
| BM | *$Re^{3+}/Re$* | *-0.02* | *0.78* | *1.74* | *1.49* |
| $J_g$ | $C^{4+}/C$ | 0.14 | 0.94 | 1.90 | 1.65 |
| BM | *$Au^{1+}/Au$* | *0.15* | *0.95* | *1.91* | *1.66* |
| BM | *$Pt^{3+}/Pt$* | *0.16* | *0.96* | *1.92* | *1.67* |

Note:
$J_s$ - JANAF Table (Solid)
$J_l$ - JANAF Table (Liquid)
$J_g$ - JANAF Table (Gas)
BM - US Bureau of Mines
Italic or Red - Estimated
$Ti^{3+}/Ti^{2+}$ - Deduced
Unit - Volt

 - "Window" elements

The electrorefining process according to Table 1 is illustrated by the following:
Elements from Ba to Yb
(1) These elements tend to remain in the bath during electrolysis.
(2) Low overvoltages are effective.

Window Elements
Potential closer to $Ti^{2+}/Ti$ (Be and Mn)
(1) These elements are increasingly rejected as the overvoltage decreases.
(2) They are typically very low in commercial $TiCl_4$ and Na.
(3) They are readily removed from TiCl4 and Na by prior purification.
(4) Mn tends to evaporate preferentially during melting under a high vacuum.
Potential between $Ti^{2+}/Ti$ and $Ti^{3+}/Ti^{2+}$ (V, Al, Zr)
(1) As a practical matter, these elements, if present, cannot be effectively refined out by electrolysis.
(2) They are preferentially refined out of the $TiCl_4$ and reducing agents such as Na prior to sponge reduction.
(3) Al tends to evaporate preferentially during melting under a high vacuum.
Potential closer to $Ti^{3+}/Ti^{2+}$ (Zn, Cr, Cd)
(1) These elements are increasingly rejected as the overvoltage decreases.
(2) They are typically very low in commercial $TiCl_4$ and Na or Mg.
(3) They are readily removed from $TiCl_4$ and Na or Mg by prior purification.
Elements from B to Pt
(1) These elements tend to remain in the anode or cell residue during electrolysis.
(2) Low overvoltages are effective.

The apparatus, referred to herein as a "hybrid cell", accommodates both sponge production and in situ fused salt electrolysis of Ti sponge such that the sponge is not processed or removed from the reduction container, e.g. vessel, prior to electrolysis and the salt coproduct of the sponge producing reduction reaction comprises the electrolyte.

In the preferred embodiment the hybrid cell comprises an iron container (outer shell) in which the Ti sponge is both produced and electrolyzed. The internal walls of the container may comprise ferrous metal clad with a metal more noble than Ti on the chloride electromotive series. such as Mo, Ni or Mo/Ni. Depending on the purity desired, the base of the container may be left uncoated since it will be covered by the Ti sponge mass.

To produce high purity titanium, molybdenum has been found to be preferred reactant-contact surface material for in situ electrolysis. But, molybdenum works best when all contact with air at high temperature is avoided. This is because molybdenum oxide has a high vapor pressure and could contaminate the electrolysis cell. However, for production of less pure titanium, a metal with more ductility and resistance to oxidation than molybdenum could be useful. Iron, as well as nickel and its alloys are examples and nickel and molybdenum alloys are also particularly useful because they are formable, weldable and stronger than nickel alone, and more ductile than molybdenum. However, the higher the molybdenum content in the nickel alloy, and the more noble the alloy is on the electromotive scale the more pure the titanium crystal will be.

Platinum group metals are ideal in terms of the electromotive series, fabricability and oxidation resistance but are very expensive.

Good electrical contact with the sponge is advantageous for the electrolysis process, A lid, transition spool, receiver and winch housing for the hybrid cell may be fabricated from Ti-clad mild steel stainless steel or commercially pure Ti or Ti alloy but commercially pure Ti is preferred for ultimate purity of the product for those structural components that do not come into contact with $TiCl_4$ during the reduction step. Feed pipes in the lid allow for addition of Na (or reducing agent mixture) and $TiCl_4$ during the reduction reaction and subsequent salt bath chlorination. When Mg is used as the reducing agent, it may be charged before the lid is attached to the cell or it may be added via a port designed for the purpose. The feed pipes are preferably made form carbon steel with a Ti tip so that any erosion during the reduction process does not introduce impurities.

A power supply is connected to a current distributor (cathodic) and container (anodic). The container is located in a gas-fired or electric furnace capable of maintaining the required reduction-electrolysis operating temperatures. Preferably, forced air cooling is used to allow higher feed rates during the highly exothermic reduction step. The apparatus may include a winch assembly for raising and lowering the cathode and support assembly. Cathodes are preferably made of Ti. Heating elements located externally on the receiver may be used to heat the receiver, thereby allowing removal of adsorbed moisture from the hybrid cell when combined with procedures for evacuating the receiver and filling with argon. The receiver may be electrically isolated from the circuit by any convenient method and may rest, for example, on a truck assembly allowing for the receiver to be positioned over the cell or the titanium crystal harvesting station.

During electrolysis, current is passed from the anode to the cathode which facilitates the electrodeposition of Ti onto the cathode. Following depletion of the sponge anode the remaining salt is transferred to a holding vessel and the next reduction reaction is commenced in the hybrid cell. If the anode is not completely consumed, the residual sponge may be recovered by any suitable means. The spent salt, which is rich in $TiCl_2$, may be reacted with additional reducing agent, such as Na, to recapture the Ti as sponge which is processed by additional electrolysis or conventional sponge operations. The addition of reducing agent to recapture Ti cations in solution may preferably take place in the same vessel which facilitates sponge production and electrolysis Such that the Ti in solution becomes part of the residual anode and, the salt, now free of Ti, can be pumped out. The entire process may then be repeated, as desired to increase purity.

The high-purity Ti produced is very low in alkali metals, heavy metals, radio-active elements and oxygen. Specifically, high purity Ti is producible with less than 1 ppm, by weight, total of Na, K, Al, Fe, Cr and Ni; less than 1 ppb, by weight, total of U and Th. less than 10 ppb, by weight, total of Na and K; and less than about 100 ppm oxygen, even less than 50 ppm oxygen.

Furthermore, the method described is capable of producing titanium crystal comprising 99.99999 wt. % Ti. excluding gases and mechanically entrapped salt. Also producible is titanium crystal comprising 99.9999 wt. % Ti, excluding gases and mechanically entrapped salt, which may contain less than 50 ppm oxygen, as well as 99.99999 wt. % Ti with less than 100 ppm oxygen, and even less than 50 ppm oxygen.

Improved purity levels, even when exposing the salt bath to a steel container, are attributed in part to a "protective layer" of Ti which forms on the container walls during sponge production which effectively isolates the container wall from the salt bath during early electrolytic operations. This protection occurs during early electrolysis until sponge on the wall is consumed. This protection layer is regenerated during subsequent reductions.

Figure 3:
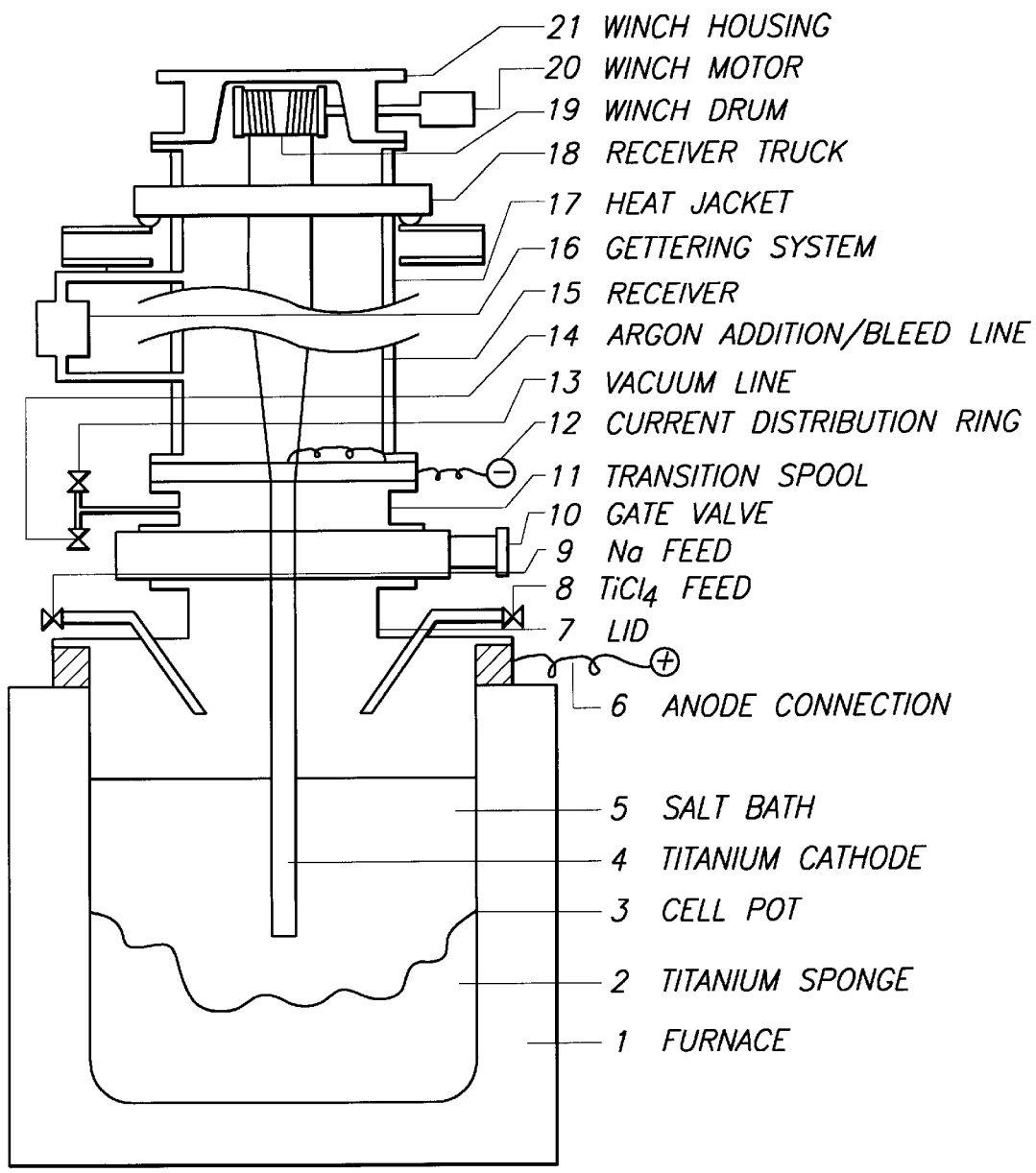
FIG. 3 is a diagram of the apparatus, also referred to as "hybrid cell"

The apparatus of the invention can be better understood by reference to tile drawings. FIG. 3 represents a hybrid cell which is capable of batch-mode operation, that is, the cell body may be disassembled or otherwise modified between reduction and electrolysis stages. Batch-mode operation, which takes advantage of the same inherent benefits of the in situ production design scheme, uses different lid assemblies for the reduction and electrolysis stages. In batch-mode operation, the container may be allowed to cool following sponge production for easy refitting of the electrolysis lid assembly.

The cell container (3) is constructed of a stainless steel outer shell for corrosion resistance under oxidation conditions, a steel inner shell for structural integrity, and an inner layer, i.e. reactant-container surface, of some metal more noble than Ti on the chloride electromotive series, such as Ni, Ni-alloy, Mo, Mo—Ni alloy or a non-conductive layer such as boron nitride. The lid (7) is constructed of steel and clad with commercially pure Ti sheet, Ni, Mo or other noble metal, as aforesaid. The container and lid are assembled and placed in a gas-fired or electric furnace (1) and supported by structural steel. Sufficient molten Na (or other combination of reducing agents) is charged to the container through the reducing agent feed port (9). $TiCl_4$ is charged to the cell through the corresponding feed port (8) until the reaction is complete. Additional $TiCl_4$ is added after all of the reducing agent has reacted to effectively chlorinate the salt bath with $TiCl_2/TiCl_3$ to a weight percentage of contained Ti ranging from about 2–12% (5). The reaction takes place at convenient pressures ranging from about 2 psig to about 4 psig and temperatures of about 800° C. to 1000° C. as measured near the container wall. The reduction process is controlled to minimize the temperatures inside the reactor and thus ensure minimum pick-up of impurities from the container and other non-Ti components. The described procedure results in a Ti sponge deposit (2) covering the container bottom and walls, the latter only partially.

The components above the lid, hereafter referred to as the superstructure, include the following: stainless steel gate valve (10), Ti-clad transition spool (11), Cu current distributor(12), Ti-constructed receiver (15) includingaheat jacket (17), receiver truck (18) and Ti-clad winch housing (21). The superstructure is electrically isolated from the circuit by any convenient method. The cell superstructure can be of any material so long as corrosion or erosion products are not allowed to enter the salt bath and contaminate the titanium crystal. Prior to electrolysis, the cell superstructure is preferably evacuated (13) to vacuum levels below 10 microns or as low as possible. Incorporating the pump down procedure with receiver heating effectively removes moisture from the atmosphere and adsorbing surfaces which is important to producing low oxygen Ti crystal. Following pumpdown, the cell is backfilled with Ar (14). Additional pumpdown cycles may be employed to further remove moisture from the system.

Figure 4:
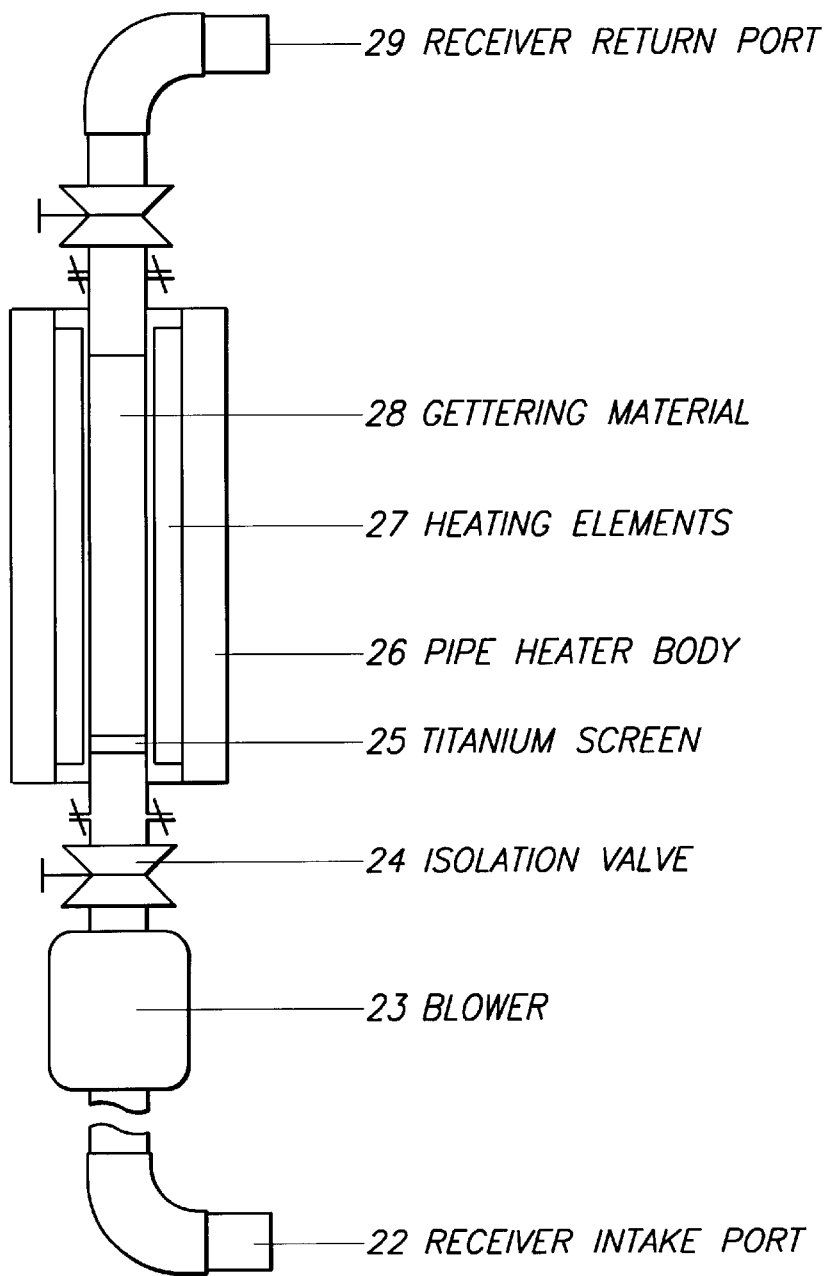
FIG. 4 is a diagram section of the receiver gettering system.

A gettering system (16) shown in FIG. 4 is advantageously used to circulate cell gases through a heated gettering material during electrolysis and pumpdown cycles to remove residual oxygen remaining in the cell. Although FIG. 4 illustrates one design of the gettering system, any equivalent system may be used. For example, convection driven circulation may be used to simplify the apparatus, but at the expense of time efficiency. Cell gases are drawn into the getterer through the receiver intake port (22) by the vacuum sealed blower (23). Ti crystal, fine Ti particles, lathe turnings from Ti ingots and alternative materials such as Zr absorb oxygen under appropriate conditions and serve as good as gettering materials (28). Also, in this way there is no risk of introducing contaminants into the cell when these materials are used. The gettering material is supported in the heated pipe by means of a Ti screen (25) located at the pipe entrance into the pipe heater (26). Cell gases pass over the Ti material which is heated to about 350 to 800° C. by the heating elements (27) and return to the receiver through the return port (29). When the gettering material is spent, the system is isolated using the isolation valves (24) and new material is added.

The operating temperature is dependent upon the salt bath composition and can range from about 650° C. to about 900° C. for typical salts. Use of mixed salts permits lower operating temperatures during electrolysis.

In practice, one limiting factor determining the maximum operating temperature is the temperature at which the container lining material forms a eutectic with Ti. For example, a Ni liner would form a eutectic with Ti at around 950° C.

Figure 5:
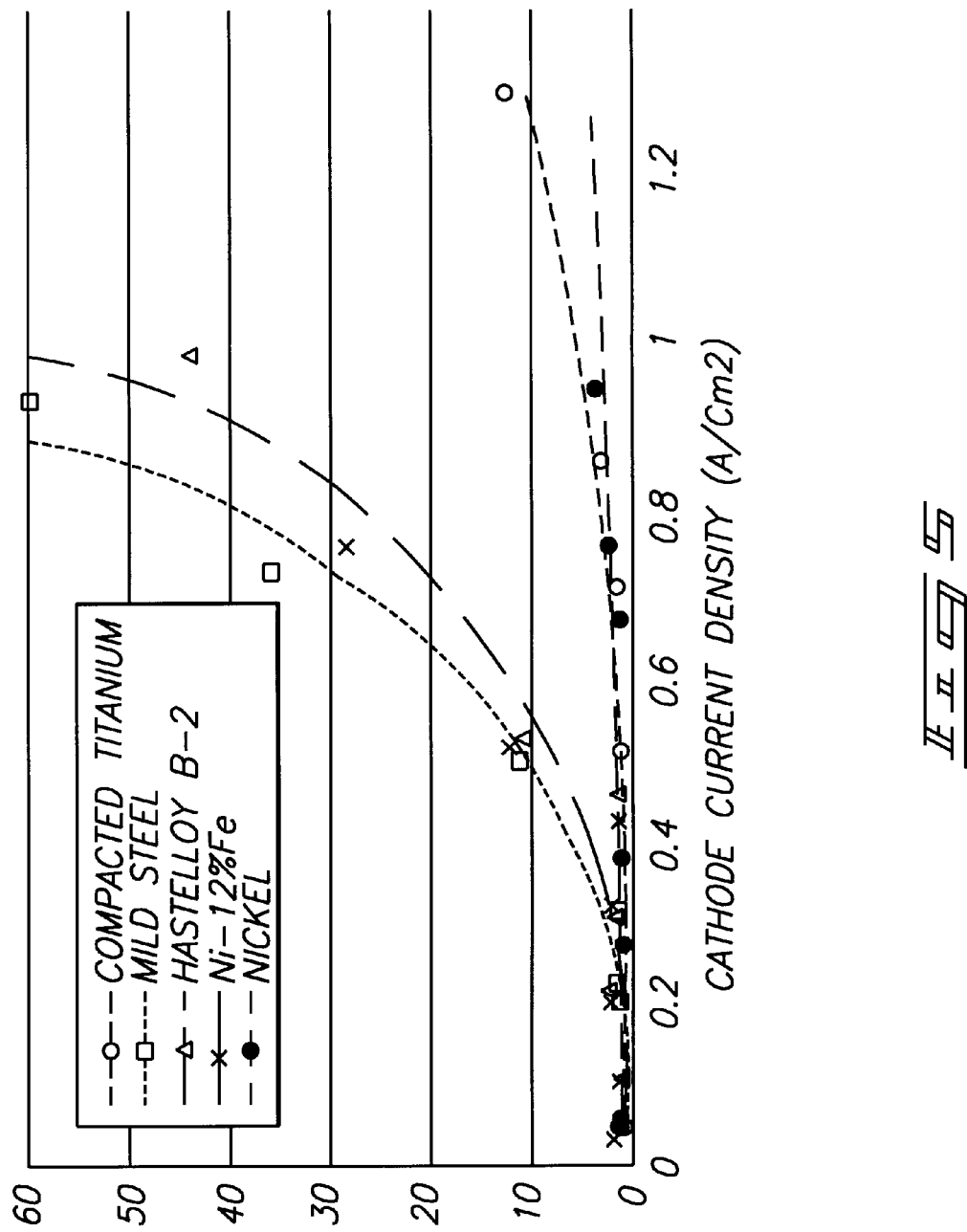
FIG. 5 is a graph of iron contamination versus current density.

The winch assembly (19,20) is used to lower the commercially pure Ti cathode (4), which is attached to a cathode support by means of electrically insulated cables. Cathodes of different lengths may be used depending upon the depth of the salt bath and sponge bed. Initially, the bottom of the cathode is about 15 to 20 inches from the sponge. The cathode support makes electrical contact with the current distributor, effectively completing the circuit. In one example, a power supply is connected to both the container anode connection (6) and the current distributor. A dc power supply provides a voltage from 0 to 12 volts and an amperage from 0 to 10,000 amps. The power supply is capable of operating under either current or voltage control. Current density may vary within individual runs and between rus, ranging from about 0.1 to 1.4 amps/cm$^2$ in reference to the initial cathode surface area. It has been found that lower current densities generally produce Ti crystal of higher purity because the lower over voltage reduces the tendency for impurity elements to deposit on the cathode. It has been observed that around 0.3 amps/cm$^2$ cathode and less is the optimum current density range for producing high purity Ti, however, because the surface area of the cathode increases as Ti dendrites form, a measurably accurate current density only exists at the beginning of electrolysis. The data in Table 2A which is illustrated in FIG. 5 and Table 2B shows the effects of varying the initial current density from 0.1 to 1.9 amps/cm$^2$. As can be seen, the data agree well with theoretical calculations for current optimization as described above. All of the titanium crystal produced from cell containers made from different materials exhibits similar quality levels when the cell is run at around 0.3 amps/cm$^2$. The data indicates that if a cell is run properly and within certain operating limits, even if using a mild steel container, very high purity titanium crystal can be produced. Containers lined with Ni or Mo (or other noble metal as discussed) widen this operating range.

TABLE 2A

Titanium Crystal Purity from Different Container Materials

| Container material | Current density (A/cm 2) | Fe in crystal (ppm) | Container material | Current density (A/cm 2) | Fe in crystal (ppm) |
|---|---|---|---|---|---|
| Compacted Ti | 0.05 | 0.6 | Ni-12% Fe | 0.03 | 2.0 |
| | 0.16 | 0.6 | | 0.10 | 0.9 |
| | 0.50 | 2.4 | | 0.20 | 1.8 |
| | 0.70 | 2.2 | | 0.26 | 1.2 |
| | 0.83 | 3.8 | | 0.43 | 2.0 |
| | 1.13 | 14.7 | | 0.51 | 10.8 |
| | | | | 0.75 | 26.6 |
| Mild steel | 0.13 | 2.0 | | | |
| | 0.22 | 2.4 | Ni | 0.09 | 1.3 |
| | 0.31 | 2.8 | | 0.19 | 1.1 |
| | 0.50 | 10.7 | | 0.28 | 1.5 |
| | 0.73 | 35.7 | | 0.38 | 1.6 |
| | 0.93 | 59.7 | | 0.66 | 1.8 |
| | | | | 0.75 | 3.2 |
| Hastelloy B-2 | 0.10 | 1.2 | | 0.94 | 5.2 |
| | 0.19 | 2.3 | | | |
| | 0.32 | 2.0 | | | |
| | 0.45 | 7.2 | | | |
| | 0.55 | 10.8 | | | |
| | 0.98 | 44.7 | | | |

TABLE 2B

Crystal Purity vs. Initial Cathode Current Density

| | Cathode Initial Current Density | Fe ppm | Oxygen ppm |
|---|---|---|---|
| Mo lined cell | 0.278 | 0.3 | 61 |
| | 0.326 | 1.7 | 56 |
| | 0.442 | 1.7 | 39 |
| | 0.478 | 0.7 | 50 |
| | 0.964 | 2.3 | 47 |
| | 1.396 | 1.7 | 79 |
| | 1.861 | 2.9 | 108 |

In one operating mode embodiment, the voltage is held constant and the current is permitted to rise until it reaches a predetermined set point. For the remainder of the run the current is held constant and the voltage drops. These trends are explained by noting that as the titanium crystal forms on the cathode, the overall resistance of the circuit decreases, resulting in a voltage drop at constant current conditions and an amperage increase at constant voltage conditions. The electrolysis parameters can be varied within the above operating ranges and variable/constant control schemes according to production requirements and anode/salt bath conditions.

Following electrolysis, the cathode is withdrawn into the receiver, isolated from the hot salt bath and allowed to cool. Cell pressures are maintained between 0 and 10 psig during the cooling cycle by adding argon as necessary. It is preferred that the receiver pressure not drop below 0 psig dulling the cooling cycle to avoid potential air leaks that may contribute to titanium crystal contamination. However, negative pressures are not a problem if the apparatus is free of leaks. The cooling cycle continues until the titanium crystal deposit temperature reaches about 100° C., preferably below 50° C.

Next, the cathode and titanium crystal deposit are removed from the cathode support and leached in a mild acid solution to remove all superficial salt deposits. It is understood that electrolysis salt is commonly mechanically entrapped by crystal intergrowth or bridging. Analyses indicate that the amount of entrapped salt typically ranges between 50 and 3000 ppm. The titanium crystal is physically stripped from the cathode and thoroughly rinsed to remove residual salts and, more importantly, remove any acid that may be present on the crystal. Removing acid completely is important because residual acid contains impurities in solution that upon evaporation of acid cause oxides to precipitate such that the crystal becomes discolored and unusable.

Drying is accomplished by either vacuum drying or forcing heated argon across the crystal. Freeze drying is also effective but slower. Crystal is dried to a moisture content less than 0.2% by weight or, preferably to undetectable levels for the highest quality product.

A single reduction reaction produces enough sponge for multiple electrolysis reactions. During the reactions, impurity elements more noble than Ti on the chloride electromotive series either remain in the sponge or fall out of solution and form smut on the anode or other surfaces. Impurity elements less noble than Ti tend to remain in the salt. There is a "window" of about 0.5 V in the chloride electromotive series within which no rejection of either type occurs. Given this, the noble metal container liner does not go into solution and deposit on the cathode. When the anode deposit has been depleted, the container is prepared for the next reduction reaction.

Electrolysis may be carried out as previously described until the anode is depleted. Upon completion or electrolysis, the remaining Ti values may be stripped from the salt bath by Na and recovered by conventional means. Alternatively, after depletion the container may be allowed to cool and removed from the apparatus. The lid is removed and any remaining Ti sponge is retrieved by any convenient removal technique. The salt, which is rich in Ti, may be treated and discarded or, prior to cooling the container, reacted with additional reducing agent to recapture the Ti as sponge.

To recover the titanium, it is preferred to dip the cathode deposit into a weak mineral acid solution (HCl or $H_2SO_4$ are preferred). Care must be taken to exclude contamination and, where possible, employing a clean room and high purity reagents are preferred. The pH must be low enough to hold all common and expected impurities in solution. Thereafter the cathode deposit is rinsed (deionized water preferred) until the rinse water is neutral. The deposit may be removed from the cathode using titanium tools after which it is rinsed again. The large masses are crushed in a titanium crusher, as necessary. Traditional rinsing and separation of fines which typically contain most of the impurities is useful and the final rinse should be done with deionized water free of all particulate matter. Tumbling during rinsing may be helpful.

All crystal processing steps through packaging are preferably done in a clean environment. For example, it is desirable that further handling of Ti crystal from the electrode, leaching, rinsing, drying, separating of fines when appropriate, and packaging, should be performed in a clean room environment. Packaging under argon or under vacuum for transport for further processing should also be in a clean room environment. Drying under vacuum is a preferred practice although freeze drying is an option that takes longer. Heating under an argon sweep is also useful and is a suitable alternative if argon of suitable purity is available. Heating in air is a possibility but there are risks of surface oxidation or even ignition. For the absolute ultimate in purity, preferred drying practice is to dry the titanium crystal under vacuum in vacuum tight containers. These containers can then be sealed under vacuum or back filled, or even pressurized, with argon.

The resulting Ti crystal has an acicular, dendritic morphology, with occasional crystals growing in lenticular, tabular or blocky shapes. Individual crystals grow most rapidly in directions normal to the hexagonal axis when electrolysis is carried out below the alpha to beta transformation temperature. Above that temperature, individual crystals grow in a cubic habit.

In order to achieve 7N metallic purity and oxygen <30 ppm, additional purification methods must be implemented such as treatment with iodine as discussed below. Table 3 summarizes typical observed impurities in precursors, sponge, electrolytic crystal, iodide crystal and ingot indicated. Also described is the impurities left behind (rejection ratio). The information contained therein essentially outlines the processing steps or raw material source which must be addressed to produce higher purity Ti. As stated above, the elements which require additional processing to be sufficiently removed are Fe, Cr, Zr, V, Al, Mn, Na, K, Cu, Ni, U and Th. Proper use of information in Table 3 enables production of 99.99999 Wt % titanium. Table 4 indicates affect of additional processing on the impurities noted.

Where ultra-low oxygen is desired it is advantageous to further refine crystal product from the hybrid process. The preferred method for doing this is to employ the iodide process in tandem with the above.

Refining options are listed in Table 3 and lists typical impurity levels by element for each stage in the process. The most important elements for electronic applications were listed above. Table 3 summarizes the preferred strategies for these elements. Crystal from the hybrid cell electrolysis is then processed to remove salt by procedures discussed above.

TABLE 3

Matrix of elements - Sources and Methods of Purification

| | | typical purity levels | | | | | | Rejection Ratios (approx.) | | |
| --- | --- | --- | --- | --- | --- | --- | --- | --- | --- | --- |
| Element | Comments | TTC | Na | sponge | crystal | iodide | ingot | electr. | iodide | e-beam |
| Li | alkali metal - no significant sources | <0.02 | <10 | <0.005 | <0.005 | <0.005 | <0.005 | — | — | complete |
| Na | alkali metal - present during electrolysis - removed in leaching and e-beam melting | 0.2 | Major | 0.5 | 25 | <0.005 | <0.01 | — | — | complete |
| K | alkali metal - present during electrolysis - removed in leaching and e-beam melting | <5 | 300 | <0.01 | 100 | <0.005 | <0.01 | — | — | complete |
| Rb | alkali metal - no significant sources | <0.08 | 0.01 | <5 | <5 | <5 | <5 | — | — | complete |
| Cs | alkali metal - present in Na - forms chloride salt removed in leaching | — | 5 | <0.01 | <0.01 | <0.01 | <0.01 | — | — | complete |
| Fr | alkali metal - no significant sources | — | — | — | — | — | — | — | — | complete |
| Be | alkaline earth metal - no significant sources | <0.007 | <0.5 | <0.005 | <0.005 | <0.005 | <0.005 | — | — | partial |
| Mg | alkaline earth metal - removed in electrolysis/leaching and e-beam melting | 1 | 10 | 5 | 0.05 | <0.01 | <0.01 | complete | complete | complete |

TABLE 3-continued

Matrix of elements - Sources and Methods of Purification

| Element | Comments | typical purity levels | | | | | Rejection Ratios (approx.) | | |
| --- | --- | --- | --- | --- | --- | --- | --- | --- | --- |
| | | TTC | Na | sponge | crystal | iodide | ingot | electr. | iodide | e-beam |
| Ca | alkaline earth metal - chlorides and oxides formed during reduction chlorides removed during leaching - remaining oxides not removed in melting oxide has high melting pt (2927 C.) and boiling pt (3500 C.) not identified as major contaminant in sputtering applications | <5 | 330 | 5 | 0.3 | 0.2 | 0.8 | complete | complete | none |
| Sr | alkaline earth metal - not analyzed at low (sub ppm) levels high vapor pressure and relatively low melting point support thorough e-beam removal | | 100 | | | | | complete | complete | complete |
| Ba | alkaline earth metal - forms chloride removed during leaching | — | 2 | <0.005 | <0.005 | <0.005 | <0.005 | — | — | — |
| Ra | alkaline earth metal - no significant sources | — | — | — | — | — | — | — | — | — |
| Sc | no significant sources | <0.02 | <0.03 | <0.05 | <0.05 | <0.05 | <0.05 | — | — | — |
| Y | no significant sources | <20 | — | <200 | <200 | <200 | <200 | — | — | — |
| La | no significant sources | <0.02 | — | <0.005 | <0.005 | <0.005 | <0.005 | — | — | — |
| Zr | nominal amount in Na - some rejection during electrolysis slight concentration during e-beam melting - segregable into liquid phase not identified as major contaminant in sputtering applications | <0.04 | 2 | 1 | 0.25 | 0.2 | 0.2 | none | partial | none |
| Hf | no significant sources | <0.03 | 2 | 0.01 | <0.01 | <0.01 | <0.01 | 99.5% | — | none |
| V | found predominantly in Na as an oxide-distillation of $TiCl_4$ provides adequate removal - not rejected in electrolysis - not removed in e-beam | <0.01 | 8 | 0.15 | 0.15 | | 0.1 | none | — | none |
| Nb | no significant sources - rejected in electrolysis | <0.2 | — | 2 | <0.2 | <0.2 | <0.2 | complete | — | none |
| Ta | no significant sources - partially rejected in electrolysis | — | — | <5 | <5 | <5 | <5 | 99.5% | — | none |
| Cr | found in $TiCl_4$ and Na partial rejection in electrolysis - volatility aids in e-beam purification - partial rejection in iodide cell - stainless steel in processing can influence amounts | 0.1 | <5 | 10 | 1 | | 0.5 | 80% | partial | 65% |
| Mo | no significant sources - strongly rejected in electrolysis - electrochemically noble | <0.03 | <6 | 0.3 | <0.05 | <0.05 | <0.05 | complete | — | none |
| W | no significant sources - strongly rejected in electrolysis - electrochemically noble | <0.02 | 5 | <0.01 | <0.01 | <0.01 | <0.01 | complete | — | none |
| Mn | picked up during sponge production - usually attributed to steel pots - combatable with alternate reduction vessel construction material and increased dwell time in e-beam hearth | 0.02 | <1.2 | 5 | 20 | | 0.02 | none | partial | 90% |
| Tc | no significant sources | — | — | — | — | — | — | — | — | — |
| Re | no significant sources - strongly rejected in electrolysis | — | — | <0.01 | <0.01 | <0.01 | <0.01 | complete | — | — |
| Fe | rejected in electrolysis - (chemically and electrochemically) contamination usually attributed to steel pots used in reduction and electrolysis - removable with alternate vessel construction material partial rejection in iodide cell - no removal in e-beam | 0.4 | 2.4 | 100 | 0.4 | | 0.4 | 99.5% | partial | none |
| Ru | no significant sources | — | — | — | <0.01 | <0.01 | <0.01 | — | — | — |
| Os | no significant sources | — | — | — | <0.01 | <0.01 | <0.01 | — | — | complete |
| Co | trace amounts usually present in sponge - generally rejected in electrolysis higher vapor pressure permits removal in e-beam melting | <0.002 | <25 | 0.1 | 0.025 | <0.005 | <0.005 | 99.8% | — | complete |
| Rh | no significant sources | — | — | — | <0.05 | <0.01 | <0.01 | <0.05 | — | — |
| Ir | no significant sources | — | — | — | — | — | <0.01 | — | — | — |
| Ni | trace amounts in $TiCl_4$ and Na - strongly rejected in electrolysis partial rejection in iodide and e-beam | 0.02 | <9 | 5 | 0.03 | 0.03 | 0.01 | 99.9% | — | 65% |
| Pd | no significant sources- electrochemically noble | — | <5 | <0.01 | <0.01 | <0.01 | <0.01 | complete | — | — |

TABLE 3-continued

Matrix of elements - Sources and Methods of Purification

| Element | Comments | typical purity levels | | | | | | Rejection Ratios (approx.) | | |
| --- | --- | --- | --- | --- | --- | --- | --- | --- | --- | --- |
| | | TTC | Na | sponge | crystal | iodide | ingot | electr. | iodide | e-beam |
| Pt | no significant sources - electrochemically noble | — | — | <0.05 | <0.05 | <0.05 | <0.05 | complete | — | — |
| Cu | trace amounts in TiCl$_4$ and Na - partial rejection in electrolysis ambient sources also contribute - high vapor pressure permits e-beam removal when combined with longer hearth dwell times | 0.25 | <18 | 5 | 1 | 0.4 | 0.04 | 99.8% | partial | 90% |
| Ag | no significant sources - electrochemically noble - high vapor pressure | <3 | — | <0.05 | <0.05 | <0.05 | <0.05 | — | — | complete |
| Au | no significant sources - electrochemically noble - high vapor pressure | <2 | <0.004 | <0.05 | <0.05 | <0.05 | <0.05 | — | — | complete |
| Zn | present in TiCl$_4$ and Na - not rejected in electrolysis - high vapor pressure | 1.3 | 30 | 0.2 | <0.05 | <0.05 | <0.05 | — | — | comlete |
| Cd | no significant sources - partial rejection in electrolysis - high vapor pressure | 2 | — | <0.05 | <0.05 | <0.05 | <0.05 | — | — | complete |
| Hg | no significant source - rejected in electrolysis - very high vapor pressure | <0.3 | <4 | <0.1 | <0.1 | <0.1 | <0.1 | complete | — | complete |
| B | no significant sources - partial rejection in electrolysis - | <0.7 | 2 | <0.01 | <0.01 | <0.01 | <0.01 | — | — | — |
| Al | present in TiCl$_4$ and Na in small amounts - partial rejection in electrolysis very high vapor pressure permits thorough e-beam removal | 1 | 4 | 5 | 1 | 0.3 | 0.05 | 80% | partial | 80% |
| Ga | no significant sources | — | 0.7 | <0.05 | <0.05 | <0.05 | <0.05 | — | — | complete |
| In | no significant sources | 0.015 | — | <0.05 | <0.05 | <0.05 | <0.05 | — | — | — |
| Tl | no significant sources | <0.06 | — | <0.01 | <0.01 | <0.01 | <0.01 | — | — | — |
| Si | present in TiCl$_4$ and Na in small amounts partial e-beam removal | 1.3 | 30 | 5 | 0.1 | 0.1 | 0.05 | 98% | partial | 50% |
| Ge | no significant sources | <1 | — | <0.05 | <0.05 | <0.05 | <0.05 | — | — | — |
| Sn | present in TiCl$_4$ and Na - rejected in electrolysis - removed in e-beam | 0.4 | <12 | 5 | <0.05 | <0.05 | <0.05 | complete | — | complete |
| Pb | present in TiCl$_4$ rejected in electrolysis - removed in e-beam | 0.7 | — | 1 | <0.01 | <0.01 | <0.01 | complete | — | partial |
| N | non-metallic impurity picked up during processing | — | <3 | — | <10 | <10 | <10 | — | — | — |
| P | no significant sources | 0.7 | <20 | 0.1 | <0.01 | <0.01 | <0.01 | complete | — | — |
| As | no significant sources | 0.1 | — | 0.5 | <0.01 | <0.01 | <0.01 | complete | — | — |
| Sb | no significant sources | — | — | 1 | <0.05 | <0.05 | <0.05 | complete | — | — |
| Bi | no significant sources | <0.03 | <0.01 | <0.02 | <0.02 | <0.02 | <0.02 | — | — | — |
| O | present in TiCl$_4$ oxychlorides - present in Na as Na$_2$O present in sponge and subsequent crystal - readily removed in iodide process slight increase following e-beam melting | 200 | — | 200 | 75 | 30 | >30 | partial | >5:1 | none |
| S | present in TiCl$_4$ and Na - removed in e-beam melting | 0.6 | 10 | 0.1 | 0.1 | <0.05 | <0.05 | none | — | complete |
| Sc | no significant sources | <2 | — | <0.05 | <0.05 | <0.05 | <0.05 | — | — | — |
| Te | no significant sources | <0.4 | — | <0.05 | <0.05 | <0.05 | <0.05 | — | — | — |
| U | no significant sources - affects sputtering applications | <0.02 | 0.006 | <0.0005 | <0.0005 | <0.0005 | <0.0005 | — | — | none |
| Th | no significant sources - affects sputtering applications | <0.02 | — | <0.0005 | <0.0005 | <0.0005 | <0.0005 | — | — | none |
| Halogens | no significant sources - easily volatized during e-beam melting | | | | | | | | | |
| Noble Gases | no significant sources - easily volatized during e-beam melting | | | | | | | | | |
| Lanthanides | no significant sources | | | | | | | | | |
| Actinides | no significant sources | | | | | | | | | |
| Other | omitted elements have no significant sources and/or are consistently at detection limits | | | | | | | | | | note:
"—" denotes not determined

TABLE 4

| Material/Processing Step | Typical Impurity Amount | | | | | | | | | | | | | |
|---|---|---|---|---|---|---|---|---|---|---|---|---|---|---|
| | Fe | O | Cr | Zr | V | Al | Mn | Na | K | U | Th | Cu | Ni | Total |
| Sponge Precursors | | | | | | | | | | | | | | |
| Raw Sodium | 2.4 | — | <5 | — | 8.2 | 4 | <1.2 | — | 300 | 0.006 | — | <18 | <9 | |
| Filtered Sodium | 0.9 | — | 0.8 | 2 | 0.02 | 1.6 | 0.4 | — | 300 | 0.006 | — | 1.7 | 0.9 | |
| Removes metal oxides | | | | | | | | | | | | | | |
| Distilled Sodium | 0.5 | — | 0.4 | 0.05 | 0.01 | 1.0 | 0.3 | — | 300 | 0.006 | — | 1.5 | 0.8 | |
| Removes metal oxides and oxychlorides | | | | | | | | | | | | | | |
| Distilled $TiCl_4$ | 0.4 | — | 0.1 | <0.02 | <0.004 | 0.4 | 0.01 | 0.08 | <5 | <0.02 | <0.02 | 0.25 | 0.01 | |
| Removes metal oxides and oxychlorides | | | | | | | | | | | | | | |
| Sponge using Ni- or Mo-lined pot | 1 | 300 | 0.5 | 0.05 | 0.02 | 0.4 | 0.3 | — | — | <0.02 | <0.02 | 1 | 0.5 | <2.10 |
| Electrolysis | 0.01 | <100 | 0.1 | 0.015 | <0.02 | 0.08 | 0.3 | — | — | <0.0005 | <0.0005 | 0.2 | <0.003 | <0.75 |
| Removes metal impurities, some gases | | | | | | | | | | | | | | |
| Thermal Iodide Decomposition | 0.01 | <30 | 0.05 | 0.01 | <0.02 | 0.025 | 0.05 | — | — | <0.0005 | <0.0005 | 0.2 | <0.003 | <0.75 |
| Reduces oxygen | | | | | | | | | | | | | | |
| Electron-Seam Melting | 0.01 | <30 | <0.02 | 0.01 | <0.02 | <0.01 | 0.003 | <0.001 | <0.001 | <0.0005 | <0.0005 | <0.01 | <0.003 | <0.1 |
| Removes volatile elements | | | | | | | | | | | | | | |

Iron has been identified as a major contaminant for titanium sputtering targets as it degrades sputtered film patterning and circuit element registry. In order to achieve 7N purity in metallics, Fe contamination in finished titanium targets must be limited to about <0.01 ppm.

One primary source of iron is steel containers used for sponge production and electrolysis. Ti sponge precursors generally contain <5 ppm Fe whereas subsequent sponge contains about 50–100 ppm Fe. The extreme temperatures during $TiCl_4$ reduction permit Fe from the container walls to finds its way into the sponge and affect Ti purity. The cell superstructure can also contribute Fe in the form of rust for example. In these containers, the maximum purity level which can be achieved consistently in crystal is about 0.2–0.4 ppm Fe, with <1 ppm Fe being typical. Lesser contamination sources include steel processing equipment and ambient contamination.

Alternative container materials have been employed which have significantly lowered the observed iron levels in titanium crystal. For example, nickel and molybdenum containers have been used successfully to produce titanium crystal with <0.1 ppm Fe. Other materials that may be used are tungsten, platinum. and Mo/Ni alloys. When using container materials more noble than Mo, the Fe level that can be achieved in crystal is governed by the Fe level in the sponge, primarily.

Nickel has a reasonable cost, availability, machinability, demonstrated utility, useable Ni-Ti eutectic melting temperature and electrochemical nobility according to the chloride electromotive series. Molybdenum, tungsten or platinum use incurs additional material costs but each provides better electrochemical nobility and a higher eutectic melting point with Ti than does nickel.

Electrolysis conditions can be optimized to limit the amount of Fe and other impurities which may deposit on the cathode. Low current densities (cathode/anode) minimize the potential for these impurities to contaminate the Ti crystal. It has been found that the ideal current density is about 0.3 amps/$cm^3$ and lower. Operating at such conditions has demonstrated a rejection ratio of more than 250:1, even when using steel containers. (Alternate container materials will increase this rejection by an order of magnitude to >2000:1.)

To produce Ti containing sub-ppm Fe levels the possibility of iron contamination from crystal processing equipment and other ambient sources should be considered. Fe contamination in crystal from the cell superstructure can be multiples larger than that from sponge. Therefore, all refining cell structural components (other than the container) should be constructed of or otherwise clad with Ti. The only limitation is that during the reduction step, any Ti used in the superstructure must not be allowed to contact $TiCl_4$ at temperatures hot enough to react with the metal. Likewise, any additional processing equipment which directly contacts the Ti crystal should be commercially pure Ti.

Figure 6:
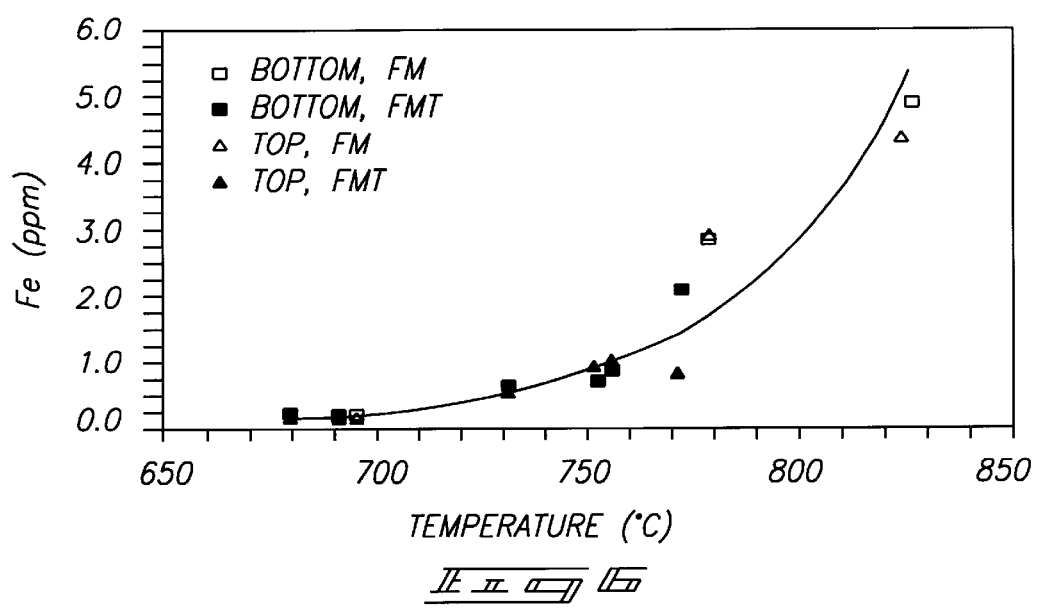
FIG. 6 is a graph showing the temperature effect on Fe rejection with a Mo-lined container.

As shown in FIG. 6, electrolysis temperature has an effect on Fe rejection for example, in a container as shown in FIG. 7. As observed, temperatures below about 750° C. are increasingly effective against Fe. Preferably, temperatures below 700° C. are used. For the ultimate in purity, even lower temperatures can be achieved by the use of LiCl or other salts whose additions lower the melting point of the salt bath used for electrolysis. Reduced temperatures reduce overall energy requirements and also reduce wear and tear on equipment. However, use of these salts require added safeguards against water entry as they are often more hygroscopic than is NaCl or KCl and may contain significant moisture as purchased. Water dissolved in the salt bath adds to the oxygen in the refined crystal and is to be avoided by all means possible, including but not limited to: 1) pre-drying salt before use by conventional means including distillation, 2) vacuum treating the electrolysis bath. 3) cooking the electrolysis bath in contact with sponge, 4) maintaining a bath cover of dry argon gettered as described, and 5) producing the other salts by co-reduction (while excluding moisture), for example by using a Li+Na mixture for the reduction to produce a LiCl+NaCl salt mixture that melts at lower temperatures.

Iodide thermal decomposition provides some additional purification of Fe and other metals. Some Fe removal occurs during E-beam melting because Fe has a higher vapor pressure than Ti at the melting point of Ti. Whereas the iodide process rejects most metallic impurities in the range between 10% and 99%. its primary value lies in its ability to reject oxygen. This is explained further below.

Low oxygen Ti has been desired by chip manufacturers in recent years because oxygen has been shown to affect the resistivity of deposited Ti layers on microprocessors. A method to consistently produce titanium with less than 100 ppm oxygen and less than 30 ppm oxygen is described below.

There are numerous oxygen sources; from sponge precursors to E-beam melting. $TiCl_4$ and Na both contain oxygen in the form of oxides and oxychlorides which can increase subsequent sponge oxygen levels. During sponge production, additional oxidation can occur as residual moisture in the reduction vessel reacts with sponge to form titanium oxides. During post-electrolysis crystal processing, which includes acid leaching to remove residual salts, the Ti crystal may be oxidized further. E-beam melting can introduce oxygen if special consideration is not given to melt chamber vacuum integrity and residual moisture.

By combining sponge production. electrolysis and E-beam melting it is possible to produce Ti crystal and sputtering targets with <100 ppm oxygen. But, as is discussed below, treatment with iodine and decomposition of titanium iodide enables oxygen to be reduced to less than about 50 ppm, and even less than about 30 ppm in feedstock to be E-beam melted.

In order to produce titanium containing <30 ppm oxygen, iodide thermal decomposition processing is used with high purity titanium crystal produced as described above as the feed. Iodide cells consistently produce Ti crystal bar with <30 ppm oxygen. Table 5 contains typical results from iodide thermal decomposition of Ti crystal.

TABLE 5

Typical Iodide Bar Oxygen Levels*

| Run # | $Ox_1$ | $Ox_2$ | $Ox_3$ | Average |
|---|---|---|---|---|
| 1 | 20 | 39 | 13 | 24 |
| 2 | 9 | 19 | 26 | 18 |
| 3 | 32 | 22 | 26 | 27 |
| 4 | 19 | 9 | 12 | 13 |
| 5 | 21 | 18 | 25 | 21 |
| 6 | 30 | 8 | 18 | 19 |
| 7 | 12 | 10 | 16 | 13 |
| 8 | 13 | 25 | 34 | 24 |
| 9 | 18 | 36 | 14 | 23 |
| 10 | 5 | 16 | 15 | 12 |

*All table values in ppm by weight

The iodide thermal decomposition process may be used in conjunction with the in situ production of titanium, as hereafter discussed. In this method, iodine reacts with Ti crystal according to the reactions below. Each reaction occurs over a wide range of temperatures but, reactions 6 and 7 occur at higher temperatures than reactions 4 or 5 in operating cells.

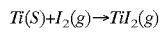

$$Ti(S)+I_2(g) \rightarrow TiI_2(g) \quad (4)$$

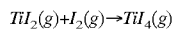

$$TiI_2(g)+I_2(g) \rightarrow TiI_4(g) \quad (5)$$

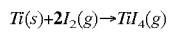

$$Ti(s)+2I_2(g) \rightarrow TiI_4(g) \quad (6)$$

Deposition occurs on a heated filament by the following disproportionation reactions.

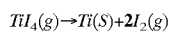

$$TiI_4(g) \rightarrow Ti(S)+2I_2(g) \quad (7)$$

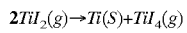

$$2TiI_2(g) \rightarrow Ti(S)+TiI_4(g) \quad (8)$$

It has been found that titanium oxides which may form or are present in the feed stock do not react with iodine and are not transported to the filament. Therefore, this process is capable of producing high purity Ti with very low oxygen levels.

It has been also found that by iodide processing, Al, Mn, Cu and Zr impurity levels can be partially reduced. Table 6 summarizes the results obtained using as input feed 3N to 4N purity Ti sponge and/or crystal. The results are translatable to the combination of iodine treatment process with the in situ sponge and crystal production described above.

TABLE 6

Iodide Cell Purification Capability

| Element | Approximate Rejection Ratio |
|---|---|
| Mn | 83% |
| Al | 70% |
| Cu | 62% |
| Cr | >50% |
| Zr | 24% |
| Ni | >20% |
| Fe | >10% |
| V | — |

Electron-beam melting and other high vacuum melting methods can further purify Ti by removing volatile metal impurities. Generally, metals with low melting points and/or high vapor pressures can be removed by electron-beam melting, also referred to as electron-beam refining. For example, aluminum and manganese, both of which have a higher vapor pressure than Ti at the melting temperature of Ti, are partially removed during electron beam melting.

To minimize oxygen pickup associated with E-beam melting, several techniques have proved useful. Residual moisture in both the Ti crystal and the melt chamber can act as an oxygen source and increase the oxygen level of Ti ingots. Maintaining a high vacuum level during melting is not sufficient to remove all residual moisture so additional moisture removal methods have been implemented. One method is melting Ti in a separate gettering hearth prior to melting crystal or iodide bar to remove moisture from the chamber. In a second method, the melt chamber walls and feeders are heated to enhance evaporation of water from the walls and crystal. The result is a controlled E-beam atmosphere in which oxygen pickup is negligible.

Chromium affects sputtering films similarly to Fe and, as such, its removal is considered important for improving sputtering target performance. In order to achieve 7N metallics, Cr levels of finished sputtering targets must be <0.05 ppm.

Chromium is found in small amounts in $TiCl_4$, Na, sponge and conventional steel reduction and electrolysis containers. Interestingly, sponge generally contains more Cr than its precursors indicating that processing equipment (i.e. containers, feed pipes) account for a majority of the sponge impurity content in sponge.

Additional purification of $TiCl_4$ is not necessary since Cr is present in relatively low levels. Commercial Na can contain as much as 5 ppm Cr but higher purity grades of Na are available which can reduce this amount to about 1 ppm Cr. This is generally accomplished by filtration of molten Na such that metal oxides are removed. Nickel piping is preferred as it will not act as a source for Cr or other metals present in steel. The above methods will enable production of Ti sponge with Cr amounts of about 0.5 ppm.

Cr is only partially rejected during electrolysis; with a rejection ratio of about 5:1. With higher purity sponge, Ti crystal will contain about 0.1 ppm Cr.

Cr can generally be removed during iodide processing and E-beam melting, though purification is not as thorough as would be expected based upon the vapor pressure differences between Ti and Cr. The accepted removal ratio is about 3:1 which will enable production of Ti ingot containing less than 0.02 ppm Cr. This removal can be partially enhanced by employing longer hearth dwell times or higher specific beam power.

Zirconium/Vanadium have not been shown to cause significant problems in sputtering target applications. However, to produce true 7N material, Zr/V amounts must be maintained below 0.02 ppm (0.04 ppm total).

Commercial Na contains about 2 ppm Zr and 8 ppm V which in turn contaminates sponge. Electrorefining, iodide processing and E-beam melting do not remove Zr/V. Zr/V have reduction potentials similar to Ti such that Zr is only partially rejected during electrolysis, and V not at all. Similarly, Zr/V behave like Ti during iodide processing limiting refining capability. Also, the vapor pressures and melting points of Zr/V are such that they are not volatized during E-beam melting.

One means of reducing Zr/V levels is to refine sponge precursors to levels consistent with desired target purity. Na is typically filtered to remove metal oxides, particularly calcium-oxides which are formed from $CaCl_2$ which is added to lower operating temperatures during NaCl reduction. Such filtering does not remove all metal oxides thoroughly; especially those oxides which are present in trace amounts. As such, Na must be refined by simple distillation. In this process, contaminant Zr/V oxides which melt/boil at much higher temperatures than pure Na may be removed to desired levels. This process could be performed by distillation to minimize the likelihood of introducing additional contaminants into the Na. Such purification will produce Na containing <0.1 ppm Zr/V. Subsequent electrorefining will produce titanium crystal containing <0.04 ppm total Zr/V.

Minor Contaminants (Al, Mn, Na, K, U, Th, Cu and Ni)

These elements are listed as minor contaminants as their sources are traceable and they are thoroughly removed during various refining stages. Outlined below is each process stage or related precursor and how the above elements are removed.

$TiCl_4$/Na: These sponge precursors contain trace amounts of most of the above elements except the radioactive elements U and Th. Na distillation will partially remove any metal oxides (i.e. $Al_2O_3$) that may be present, though complete removal is not required to produce 7N Ti material.

Electrolysis: Cu is not rejected during electrolysis to the degree predicted by thermodynamics. Al is partially rejected, with Ni being strongly rejected. Mn is not rejected at all and is generally picked up from steel containers used for sponge production and electrolysis, Implementing Ni- or Mo-lined containers will eliminate Mn contamination from container walls.

Titanium Crystal Leaching: Leaching is used to remove residual salts from Ti crystal; specifically NaCl and KCl, thus lowering the Na and K levels.

Iodide Processing: None of the above elemental levels are significantly reduced, with Zr, Al and Mn being only partially removed.

Electron-Beam Melting: Some of the above elements are more volatile than Ti and are thoroughly removed during E-beam melting. Ni, U and Th are not present in crystal in sufficient quantities to require additional purification. The remainder of the elements (especially Na and K as mechanically entrapped salt) are essentially completely removed. Table 7 below contains vapor pressures of a representative number of elements and their approximate removal ratios.

TABLE 7

Elemental Physical Data @ 1700° C.

| Element | Vapor Pressure (mmHg) | Melting Point (° C.) | E-beam Removal (approximate) |
|---|---|---|---|
| Sodium | >$10^3$ | ~100 | 100% |
| Aluminum | 4.5 | ~600 | 80% |
| Copper | 2.9 | ~1080 | >90% |
| Chromium | 1.0 | ~1850 | 65% |
| Iron | 0.5 | ~1500 | none |
| Titanium | $6 \times 10^{-3}$ | ~1650 | — |
| Vanadium | $2 \times 10^{-3}$ | ~1900 | none |
| Zirconium | $2 \times 10^{-6}$ | ~1830 | none |

The following example further illustrates the invention.

EXAMPLE 1

Hybrid Cell Electrolysis

A hybrid cell run was performed for both the reduction stage and subsequent electrolysis. The mild steel container had previously been used for four sponge production reactions such that a layer of Ti-Fe alloy was present on the walls. Initially, 4 650 lbs of molten Na was gravity fed to the cell container and kept under an argon atmosphere. The Na was reacted with 11,220 lbs of $TiCl_4$ such that the resulting bath contained about 2,010 lbs of Ti sponge and 11,820 lbs NaCl with approximately 2,040 lbs $TiCl_2$.

The container was allowed to cool sufficiently and the domed lid used during reduction was removed and replaced with a lid designed for electrolysis. Care was taken to minimize any contamination that may have entered the container during lid changeover. The container was relocated to the electrolysis station and the necessary components were assembled (i.e. gate valve, transition spool, circuit connections). The entire assembly was leak checked to ensure vacuum integrity.

The furnace was heated to 850° C. and the container was soaked for about 12 hours. Temperature was then increased to 900° C. and a thermowell was inserted into the cell to determine salt bath temperature, which was 825° C.

The receiver was pumped down to a vacuum of 9 microns. The pump down level is generally indicative of the balance between the vacuum system and the amount of moisture adsorbed on the apparatus interior surfaces. After evacuation, the cell was backfilled with argon to a pressure of around 4 psig, which was maintained for the duration of the run.

A 36 inch length cathode was used for the first run based upon anode depth determination during thereowell insertion. The cathode assembly was lowered into the salt bath and the power supply was turned on. Initially, the voltage was set at 6 volts with the current at 2500 amps. This resulted in an initial current density of about 0.5 amps/$cm^2$. The run then proceeded under current control. Table 8 shows run data.

The run lasted 66.5 hours after which the cathode and titanium crystal deposit were withdrawn into the receiver and allowed to cool. It is during the cooling cycle, at least initially, that the heated crystal is exposed to cell gases which the crystal may absorb, such as residual oxygen. During the cooling cycle, forced air was used to externally cool the receiver in an effort to speed up the cooling cycle in order to minimize the time which the crystal was susceptible to this source of contamination.

Following cooling, the receiver was positioned over the harvesting station and the crystal harvest was lowered into a leach acid tank. The tank contained a 1% acid solution made up of 0.5% sulfuric/0.5% citric by weight. The harvest remained in this tank for about 30 minutes and was then transferred to an identical tank and solution where it remained for 17 hours. Once superficial salt (dragout) is removed, one effect of extended leach time is to remove occluded or mechanically entrapped salt to some degree. After the leaching cycle, which removes residual dragout salt and may etch the crystal surface slightly, the harvested titanium was submerged in deionized water 3 times. This effectively removes the acid which, if left unrinsed, can cause significant chemical burns (i.e. surface oxidation). The titanium crystal was manually removed from the cathode and thoroughly rinsed by spraying deionized water over the crystal for about 2 hours. The crystal was dried by blowing heated argon through it until it reached a moisture content of about 0.1% by weight.

TABLE 8

Example 1 Run Data

| Run Hours | Volts | Amps | Amp Hours | Run Hours | Volts | Amps | Amp Hours |
|---|---|---|---|---|---|---|---|
| 0 | 6 | 2500 | 0 | 28 | 1.8 | 2500 | 75175 |
| 0.4 | 3.9 | 2500 | 1062 | 34 | 1.8 | 2500 | 89164 |
| 5.7 | 2.3 | 2500 | 14804 | 37 | 1.6 | 2500 | 97911 |
| 8.7 | 2.1 | 2500 | 22655 | 49 | 1.6 | 2500 | 129034 |
| 12.3 | 2.0 | 2500 | 32343 | 52 | 1.6 | 2500 | 136937 |
| 18 | 1.9 | 2500 | 46925 | 58 | 1.6 | 2500 | 152793 |
| 23.5 | 1.8 | 2500 | 61173 | 66.5 | 1.6 | 2500 | 176875 |

Note:
The Volt/amps correlation can depart considerably from that evident here.

Samples were taken for analyses and the results are summarized in Table 9. Included in the table are comparative purity ranges for crystal which is typically produced by fused salt electrolysis of processed Ti sponge in a mild steel container. As is evident from the data, titanium crystal produced in situ as described exhibits improved purity levels. The lower Fe levels support the view that the eliminated sponge processing steps do significantly contribute to Fe contamination in subsequently produced crystal. The data also suguest that implementing a Mo-lined cell container will sinificantly reduce Fe contamination and permit production of crystal with about 0.01 ppm Fe. The observed lower oxygen levels are due to the minimization of salt moisture which acts as an oxygen source.

The electrolytic run had a calculated current efficiency of over 50%.

Further samples were taken of crystal with various morphologies. Three distinct crystalline structures were evident: planar hexagonal, small denidritic and bulky "inucaets". The analytical results are listed in Table 10 for oxygen only. Included in the sampling was a standard sample in which no particular morphologies were segregated. As expected, the surface area-to-weight ratio of the samples correlates well with the oxygen levels, reinforcing, the importance of the ratio of surface area to crystal volume.

TABLE 9

Titanium Crystal Purity Levels*

| Sample # | $O_{AVG}$ | $Fe_{AVG}$ |
|---|---|---|
| 1 | 74 | 0.19 |
| 2 | 99 | 0.23 |
| 3 | 92 | 0.33 |
| 4 | 78 | — |
| comparative ranges | 125 to 300 | 1 to 5 |

It should be understood that the results appearing in tables 4, 6 and 7 may be improved by increasing vacuum tightness, using lower current density, increasing guttering capacity, lowering temperature, extending pump down time, implementing container liners and employing similar techniques.

TABLE 10

Titanium Crystal Oxygen for Different Morphologies

| Crystal shape | $Ox_1$ | $O_2$ | $O_3$ | $Ox_{AVG}$ |
|---|---|---|---|---|
| unsegregated | 121 | 132 | 82 | 112 |
| small dendritic | 119 | 128 | 138 | 128 |
| planar hexagonal | 41 | 126 | 98 | 88 |
| large nuggets | 84 | 63 | 80 | 76 |

EXAMPLE 2

Iodide Thermal Decomposition

FIG. 8 illustrates a typical iodide cell to treat high purity Ti crystal to reduce the oxygen content. In this example all cell components are initially cleaned with alcohol to minimize possible contamination. The container (2) was placed in the furnace (1) and heated to 150° C. for two hours to drive off residual moisture and cleaning agent. The molybdenum liner and molybdenum screen (5) were placed in the container. About 13 pounds of Ti crystal (3) was added to the cell between the container wall and the screen. A Ti filament (4) measuring 70 cm long and 0.35 cm in diameter fitted with molybdenum feed-through rods (6) was attached to a ceramic feed-through (7) on the lid assembly (8). Vacuum grease was applied to the o-ring and the lid was sealed to the container. All remaining connections were made (i.e. vacuum lines, argon lines, iodine feed, etc.).

The container was heated from around 300° C. to around 850° C. over a period of 12 hours while the system was evacuated to about <10 millitorr to remove residual moisture contained in the titanium crystal feed. Following this process, the furnace temperature was set to 750° C.

Electrical leads were attached to the filament to accommodate resistance heating of the filament to about 1300° C. Sufficient iodine was charged to the cell to start the reaction (9). Temperatures of the container wall and filament were monitored for the duration of the run to maintain appropriate reaction conditions. During operation, the lid was water cooled to preserve o-ring integrity.

The run lasted for about 100 hours and produced about 1650 grams of Ti crystal bar containing less than 30 ppm oxygen. Input crystal was estimated to contain between 100 to 200 ppm oxygen resulting in an overall reduction of over 70%.

EXAMPLE 3

Electrolysis in Mo-lined Container)

Commercially pure Mo was fabricated into a container liner 10 inches high and 5 inches in diameter and fit into a matching container. Desired levels of Ti sponge, NaCl, KCl and TiCl₂, were charged directly into the container which was then placed in a furnace. The container was evacuated, backfilled with argon, and heated sufficiently to completely melt the salt bath. After the electrolyte had been melted, a commercially pure Ti cathode was lowered into the salt bath. The temperature of the salt bath was maintained such that the viscosity of the molten mixture was controlled during electrolysis. A power supply was connected to the submerged cathode and the container anode to facilitate electrolysis. Following electrolysis, the container was allowed to cool and the Ti crystal was removed from the container. The crystal was leached in acid, vacuum dried and analyzed for metallic impurities.

Table 11 lists comparative results for electrolysis carried out in Mo-lined containers and Fe containers. As can be seen, no Mo contamination is present in the crystal produced. However, the difference in Fe contamination is significant and clearly indicates that Mo is a better liner for producing high purity Ti.

TABLE 11

Mo-lined Container Results

| Run # | Container/Liner | Sponge (ppm) Fe | Mo | Ox | Crystal (ppm) Fe | Mo | Ox |
|---|---|---|---|---|---|---|---|
| 1 | Mild Steel | 21 | 0.14 | 325 | 2.5 | <0.05 | 63 |
| 2 | Mild Steel | 21 | 0.14 | 325 | 3.4 | <0.05 | 47 |
| 3 | Mild Steel | 21 | 0.14 | 325 | 4.5 | <0.05 | 72 |
| 4 | Mild Steel | 21 | 0.14 | 325 | 5.8 | <0.05 | 98 |
| 1 | Molybdenum | 21 | 0.14 | 325 | 0.7 | <0.05 | 50 |
| 2 | Molybdenum | 21 | 0.14 | 325 | 1.7 | <0.05 | 56 |
| 3 | Molybdenum | 21 | 0.14 | 325 | 1.6 | <0.05 | 39 |
| 4 | Molybdenum | 21 | 0.14 | 325 | 0.1 | <0.05 | 81 |

It is apparent from the foregoing that various changes and modifications may be made without departing from the invention. Accordingly, the scope of the invention should be limited only by the appended claims.

It is apparent from the foregoing that various changes and modifications may be made without departing from the invention. Accordingly, the scope of the invention should be limited only by the appended claims.

What is claimed is:

1. A high purity titanium material comprising at least one of zirconium and vanadium; titanium; and less than 0.1 ppm, by weight, total of sodium, potassium, aluminum, iron, chromium, zirconium, vanadium, and nickel, excluding gases and mechanically entrapped salt.

2. High purity titanium material according to claim 1 further comprising a total of uranium and thorium of less than 1 ppb, by weight.

3. High purity titanium material according to claim 1 having not more than 75 ppm oxygen.

4. High purity titanium material according to claim 1 wherein the total of sodium and potassium is less than 10 ppb, by weight.

5. High purity titanium comprising at least one of zirconium and vanadium: 99.999 wt. % titanium, excluding gases; and less than 0.75 ppm, by weight, total of sodium, potassium, aluminum, iron, chromium, nickel, zirconium, vanadium, manganese, copper, uranium and thorium.

6. High purity titanium comprising at least one of zirconium and vanadium; titanium; less than 0.75 ppm, by weight, total of sodium, potassium, aluminum, iron, chromium, nickel, zirconium, vanadium, manganese, copper, uranium and thorium, excluding gases; and less than 100 ppm oxygen.

7. High purity titanium according to claim 5 wherein the total Na and K is less than 0.05 ppm by weight.

8. High purity titanium according to claim 5 wherein the total of U and Th is less than 1 ppb, by weight.

9. High purity titanium according to claim 5 wherein the total of Na and K is less than 0.1 ppm, by weight.

10. High purity titanium comprising at least one of zirconium and vanadium; 99.9999 wt. % titanium, excluding gases; and less than 75 ppm oxygen.

11. High purity titanium according to claim 10 containing less than 30 ppm oxygen.

12. High purity titanium comprising 99.99999 wt. % titanium, excluding gases.

13. A high purity titanium according to claim 12 wherein the oxygen is not more than about 100 ppm by weight.

14. A high purity titanium according to claim 12 wherein the oxygen is not more than about 30 ppm by weight.

15. A sputtering target comprising high purity titanium according to claim 1.

16. A sputtering target comprising high purity titanium according to claim 5.

17. A sputtering target comprising high purity titanium according to claim 6.

18. A sputtering target comprising high purity titanium according to claim 8.

19. A sputtering target comprising high purity titanium according to claim 9.

20. A sputtering target comprising high purity titanium according to claim 10.

21. A sputtering target comprising high purity titanium according to claim 11.

22. A sputtering target comprising high purity titanium according to claim 12.

23. A sputtering target comprising high purity titanium according to claim 13.

24. A sputtering target comprising high purity titanium according to claim 14.

25. A thin film produced by a sputtering target according to claim 15.

26. A thin film produced by a sputtering target according to claim 16.

27. A thin film produced by a sputtering target according to claim 17.

28. High purity titanium material comprising at least one of zirconium and vanadium; titanium; and less than 0.1 ppm, by weight, total of sodium, potassium, aluminum, iron, chromium, nickel, zirconium, vanadium, manganese, copper, uranium and thorium, excluding gases and mechanically entrapped salt.

29. High purity titanium material according to claim 28 wherein the total of uranium and thorium is less than 1 ppb.

30. High purity titanium material according to claim 28 having not more than 100 ppm oxygen.

31. High purity titanium material according to claim 28 wherein the total of sodium and potassium is less than 10 ppb, by weight.

32. A sputtering target comprising high purity titanium material according to claim 28.

33. A thin film produced by a sputtering target according to claim 32.

34. The high purity titanium of claim 5 comprising at least 0.01 ppm, by weight, of at least one of vanadium and zirconium.

35. The high purity titanium of claim 6 comprising at least 0.01 ppm, by weight, of at least one of vanadium and zirconium.

36. The high purity titanium of claim 28 comprising at least 0.01 ppm, by weight, of at least one of vanadium and zirconium.

* * * * *

UNITED STATES PATENT AND TRADEMARK OFFICE
CERTIFICATE OF CORRECTION

PATENT NO.    : 6,309,595 B1
DATED         : October 30, 2001
INVENTOR(S)   : Harry Rosenberg et al.

It is certified that error appears in the above-identified patent and that said Letters Patent is hereby corrected as shown below:

Title page,
Item [54], Title, replace "TITANIUM CRYSTAL AND TITANIUM" with
-- TITANIUM MATERIALS --.
Item [73], Assignee, replace "The AltalGroup, Inc," with -- The Alta Group, Inc., --.

Column 1,
Line 46, replace "oxygen, ea. <100 ppm, is presently desired in the industry" with
-- oxygen, e.g. <100 ppm, is presently desired in the industry --.

Column 2,
Line 24, replace "capable of facilitatinl, both reduction and electrolysis" with -- capable of facilitating both reduction and electrolysis --.
Line 31, replace "produce $TiI_2$ and $TiI_4$ and thermally decomposed in a" with
-- produce $TiI_2$ and $TiI_4$ and thermally decomposed in a --.
Line 63, replace "of titaidum purity and references to amounts of impurities" with
-- of titanium purity and references to amounts of impurities --.

Column 3,
Line 8, replace "LECO gas analyzers for gas anaivsis using calibration" with -- LECO gas analyzers for gas analysis using calibration --.
Line 40, replace "(2) below. $TiCl_2$ may be reacted with excess TiC1, reaction" with
-- (2) below. $TiCl_2$ may be reacted with excess $TiCl_4$, reaction --.
Lines 52-54, insert key
-- s = solid phase
   l = liquid phase
   g = gas phase --.

Column 4,
Line 12, replace "air, salt and heat such that iron oxides form and tlake off of" with
-- air, salt and heat such that iron oxides form and flake off of --.
Line 31, replace "produced via reduction of $TiCl_4$, in a mainer such that the Ti" with
-- produced via reduction of $TiCl_4$, in a manner such that the Ti --.
Line 41, replace "chlorinated and is subsequently electrolyted Ti crystal" with
-- chlorinated and is subsequently electrolyzed Ti crystal --.

Column 6,
Line 19, replace "may be calculated from the JANAF Thlermochemical Tables, 3rd" with -- may be calculated from the JANAF Thermochemical Tables, 3rd --.
Table 1, line 64, replace "BM $Lu^{2+}$/Lu" with -- BM $Lu^{3+}$/Lu --.

UNITED STATES PATENT AND TRADEMARK OFFICE
CERTIFICATE OF CORRECTION

PATENT NO.    : 6,309,595 B1
DATED         : October 30, 2001
INVENTOR(S)   : Harry Rosenberg et al.

It is certified that error appears in the above-identified patent and that said Letters Patent is hereby corrected as shown below:

Column 7,
Table 1, line 17, replace "BM $V^{3+}/V$" with -- BM $V^{2+}V$ --.
Table 1, line 20, replace " $Ti^{3+}/Ti$" with -- $Ti^{3+}/Ti^{2+}$ --.

Column 9,
Line 46, replace "1 ppb, by weight, total of U and Th. less than 10 ppb, by" with
-- 1 ppb, by weight, total of U and Th; less than 10 ppb, by --.
Line 50, replace "titanium crystal comprising 99.9999 wt.% Ti." with -- titanium crystal comprising 99.9999 wt.% Ti, --.
Line 66, replace "by reference to tile drawings. Fig. 3 represents a hybrid cell" with
-- by reference to the drawings.-- Fig. 3 represents a hybrid cell --.

Column 10,
Line 38, replace "distributor (12), Ti-constructed received (15) includingaheat" with
-- "distributor (12), Ti-constructed received (15) including a heat --.

Column 12,
Line 49, replace "dulling the cooling cycle to avoid potential air leaks that may" with
-- during the cooling cycle to avoid potential air leaks that may --.
Line 62, replace "stripped from the cathode and thorougohly rinsed to remove" with
-- stripped from the cathode and thoroughly rinsed to remove --.

Column 14,
Line 3, replace "for transpolt for further processing should also be in a clean" with
-- for transport for further processing should also be in a clean --.

Column 16,
Line 28, move "--" to the right to be in iodide column and move "none" to the right to be in e-beam column.

Column 17,
Under Element col., line 50, replace "Sc" with -- Se --.

Column 18,
Under e-beam col., line 19, replace "comlete" with -- complete --.

Column 19,
Under Material/Processing Step col., line 21, replace "Electron-Seam Melting" with
-- Electron-Beam Melting --.
Line 47, replace "are tungsten, platinum. And Mo/Ni alloys. When using" with
-- are tungsten, platinum, and Mo/Ni alloys. When using --.

UNITED STATES PATENT AND TRADEMARK OFFICE
CERTIFICATE OF CORRECTION

PATENT NO. : 6,309,595 B1
DATED : October 30, 2001
INVENTOR(S) : Harry Rosenberg et al.

It is certified that error appears in the above-identified patent and that said Letters Patent is hereby corrected as shown below:

Column 20,
Line 54, replace "distillation, 2) vacuum treating the electrolysis bath. 3)" with
-- distillation, 2) vacuum treating the electrolysis bath, 3) --.
Line 66, replace "between 10% and and 99%. its primary value lies in its ability to"
with -- between 10% and 99%, its primary value lies in its ability to --.

Column 22,
Line 54, replace "containers, feed pipes) account for a majority of the sponge" with
-- containers feed pipes..) account for a majority of the sponge --.

Column 23,
Line 37, replace "Minor Contaminants (Al, Mn, Na, K, U, Th, Cu, and Ni)" with
-- Minor Contaminants (Al, Mn, Na, K, U, Th, Cu, and Ni): --.
Line 52, replace "for sponge production and electrolysis, Implementing Ni- or" with
-- for sponge production and electrolysis. Implementing Ni- or --.

Column 25,
Line 15, replace "cause significant chemical bums (i.e. surface oxidation). The" with
-- cause chemical burns (i.e. surface oxidation). The --.
Line 60, replace "planar hexagonal, small dendritic and bulky "inucaets". The" with
-- planar hexagonal, small dendritic and bulky "nuggets". The --.

Column 26,
Line 11, after Table 9 insert -- * All table values in ppm by weight, oxygen levels measured Using LECO oxygen analyzer and Fe by atomic absorption. Values are averages of multiple analyses. --.
Table 10, line 22, replace "$O_2$    $O_3$" with -- $Ox_2$ $Ox_3$ --.
Example 3, line 65, replace "Electrolysis in Mo-lined Container)" with -- Electrolysis in Mo-lined Container --.

UNITED STATES PATENT AND TRADEMARK OFFICE
CERTIFICATE OF CORRECTION

PATENT NO. : 6,309,595 B1
DATED : October 30, 2001
INVENTOR(S) : Harry Rosenberg et al.

It is certified that error appears in the above-identified patent and that said Letters Patent is hereby corrected as shown below:

Column 27,
Lines 35-37, delete "It is apparent from the foregoing that various changes and modifications may be made without departing from the invention. Accordingly, the scope of the invention should be limited only by the appended claims.".

Signed and Sealed this

Sixth Day of December, 2005

JON W. DUDAS
*Director of the United States Patent and Trademark Office*